United States Patent
Fukuda et al.

(10) Patent No.: US 9,647,242 B2
(45) Date of Patent: May 9, 2017

(54) HEAT-CONDUCTIVE SEALING MEMBER AND ELECTROLUMINESCENT ELEMENT

(75) Inventors: Shunji Fukuda, Tokyo-to (JP);
Katsuya Sakayori, Tokyo-to (JP);
Yasuhiro Iizumi, Tokyo-to (JP)

(73) Assignee: DAI NIPPON PRINTING CO., LTD., Tokyo-to (JP)

( * ) Notice: Subject to any disclaimer, the term of this patent is extended or adjusted under 35 U.S.C. 154(b) by 590 days.

(21) Appl. No.: 13/496,973

(22) PCT Filed: Sep. 29, 2010

(86) PCT No.: PCT/JP2010/066913
§ 371 (c)(1),
(2), (4) Date: Mar. 19, 2012

(87) PCT Pub. No.: WO2011/040441
PCT Pub. Date: Apr. 7, 2011

(65) Prior Publication Data
US 2012/0181914 A1    Jul. 19, 2012

(30) Foreign Application Priority Data

Sep. 30, 2009   (JP) ................................. 2009-228711
Apr. 9, 2010    (JP) ................................. 2010-090947

(51) Int. Cl.
*H01J 1/62*    (2006.01)
*H01L 51/52*   (2006.01)
*B32B 15/08*   (2006.01)
*C09J 7/02*    (2006.01)

(52) U.S. Cl.
CPC ............ *H01L 51/529* (2013.01); *B32B 15/08* (2013.01); *C09J 7/0296* (2013.01); *H01L 51/5243* (2013.01); *H01L 51/5246* (2013.01); *H01L 51/5259* (2013.01); *C09J 2203/326* (2013.01); *C09J 2400/163* (2013.01); *C09J 2433/00* (2013.01); *C09J 2467/00* (2013.01); *C09J 2479/08* (2013.01); *C09J 2479/086* (2013.01); *C09J 2483/00* (2013.01); *Y10T 428/24942* (2015.01)

(58) Field of Classification Search
CPC ...................... H01L 51/5243; H01L 51/5246
USPC ........................................ 313/506, 504, 512
See application file for complete search history.

(56) References Cited

U.S. PATENT DOCUMENTS

| 2005/0062395 A1 | 3/2005 | Takahashi et al. |
| 2010/0277684 A1 | 11/2010 | Fukushima et al. |

FOREIGN PATENT DOCUMENTS

| JP | 1992-054198 U | 5/1992 |
| JP | 2001-203076 A | 7/2001 |
| JP | 2004-079292 A | 3/2004 |

(Continued)

OTHER PUBLICATIONS

International Search Report: mailed Nov. 30, 2010; PCT/JP2010/066913.

*Primary Examiner* — Vip Patel
(74) *Attorney, Agent, or Firm* — Ladas & Parry LLP

(57) ABSTRACT

Provided is a heat-conductive sealing member which has high moisture barrier properties, has heat dissipation properties, and is capable of encapsulating an element by a simple method. The heat-conductive sealing member has a metal base material, an insulating layer that is formed on the metal base material, has heat conductivity and contains at least polyimide, and a tacky adhesive layer that is formed on the insulating layer and has heat resistance.

22 Claims, 7 Drawing Sheets

(56) References Cited

FOREIGN PATENT DOCUMENTS

| | | |
|---|---|---|
| JP | 2005-077553 A | 3/2005 |
| JP | 2005-093358 A | 4/2005 |
| JP | 2005-259573 A | 9/2005 |
| JP | 2006-128022 A | 5/2006 |
| JP | 2006-147528 A | 6/2006 |
| JP | 2006-255918 A | 9/2006 |
| JP | 2006-286220 A | 10/2006 |
| JP | 2006-331694 A | 12/2006 |
| JP | 2006-331695 A | 12/2006 |
| JP | 2007-099951 A | 4/2007 |
| JP | 2007-254743 A | 10/2007 |
| JP | 2008-010211 A | 1/2008 |
| JP | 2008-034142 A | 2/2008 |
| JP | 2008-181832 A | 8/2008 |
| WO | 2009/054168 A1 | 4/2009 |
| WO | 2009054168 A1 | 4/2009 |

FIG. 13A ORGANIC EL ELEMENT A
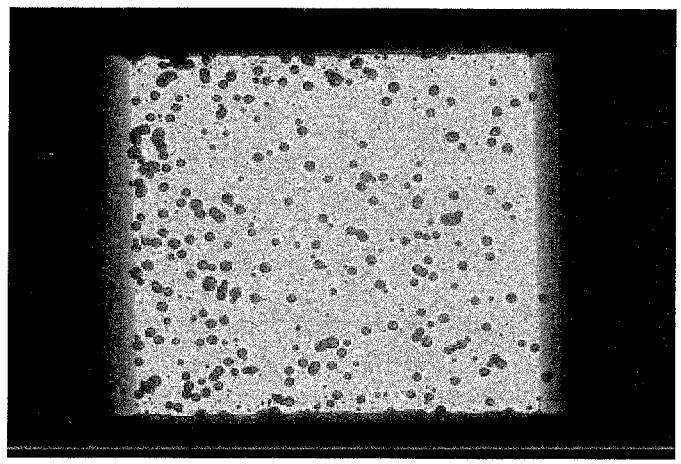
FIG. 13B ORGANIC EL ELEMENT 1
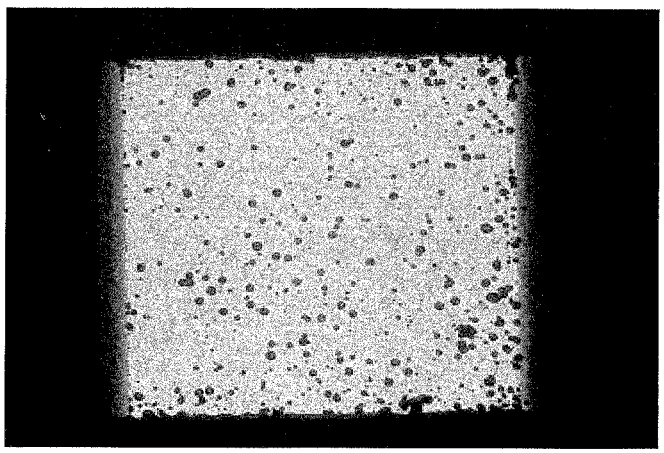

FIG. 14A  ORGANIC EL ELEMENT B
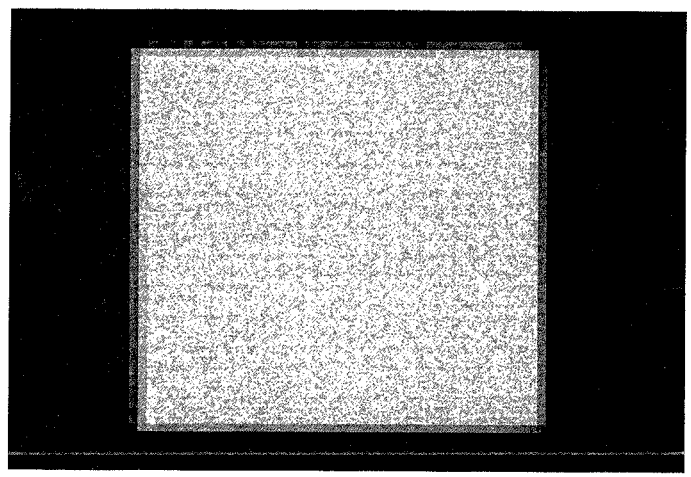
FIG. 14B  ORGANIC EL ELEMENT 4
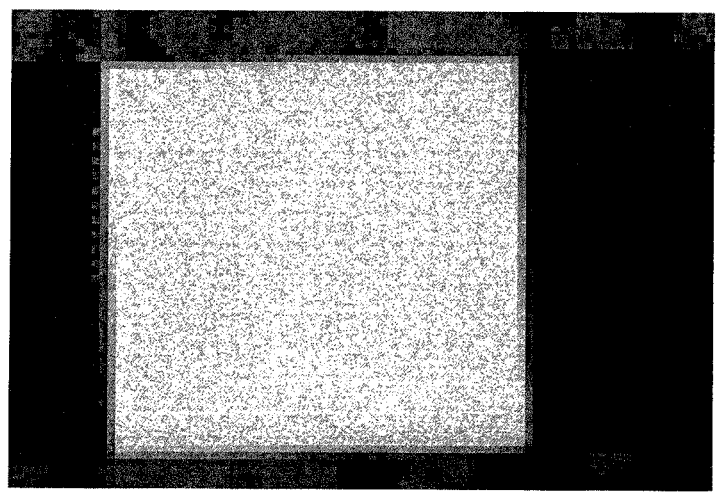

HEAT-CONDUCTIVE SEALING MEMBER AND ELECTROLUMINESCENT ELEMENT

TECHNICAL FIELD

The present invention relates to a sealing member used for the encapsulation of, for example, electroluminescent elements.

BACKGROUND ART

The configuration of an electroluminescent (hereinafter, may be abbreviated to EL) element is based on a laminated structure in which a light emitting layer and optional layers having other functions are laminated between a pair of electrodes.

EL elements have low resistance to moisture, and shrink, a dark spot and the like occur in the elements under the effect of moisture. Here, the term "shrink" means a phenomenon in which, as time elapses, the expansion of non-light emitting regions proceeds as if the light emitting region shrinks away. Also, the term "dark spot" means a non-light emitting region such as a black spot that occurs immediately after the production of an EL element. This dark spot also occasionally expands along with a lapse of time. In other words, EL elements deteriorate over time due to the presence of moisture.

Among the techniques for preventing the penetration of moisture into EL elements, encapsulation of EL elements by means of a sealing member or a sealing structure constitutes the mainstream, and investigations on various techniques have been conducted hitherto.

Furthermore, since EL elements have light emission efficiency that does not reach 100%, a portion of the energy generated as a result of recombination is converted to heat. Furthermore, the heat generated as a loss at the time of light emission is essentially likely to remain inside the EL elements. However, EL elements are generally vulnerable to heat. For this reason, if heat is retained inside an EL element for a long time or a large amount of heat is retained, there is a risk that there may occur luminescence unevenness, shortening of the service life due to heat, and at the worst, destruction of the EL element itself. Particularly, in the case of EL elements for illumination purposes, such occurrences pose a serious problem. Also, if the amount of heat is large, gas may be generated from the members constituting an element, and there is a risk that the element may be deteriorated by this outgas generated inside the element.

In order to address this problem, investigations have been conducted to impart heat dissipation properties to sealing members or sealing structures, and for example, there have been suggested a sealing member in which at least one surface of a metal plate having predetermined heat conductivity is covered with an insulating layer (see, for example, Patent Literature 1); and sealing structures in which a heat absorbent that absorbs the heat generated in EL elements, and a heat dissipater that dissipates the absorbed heat to the outside are laminated in sequence on a metal plate or a metal foil (see, for example, Patent Literatures 2 to 4). Furthermore, investigations are also being conducted to impart heat dissipation properties not to the sealing members or sealing structures, but to the substrate that supports EL elements (see, for example, Patent Literature 5).

Meanwhile, such a problem that prevention of the penetration of moisture and provision of a heat dissipation function are needed, is not limited only to EL elements. That is, the problem is not limited to elements that convert electricity to light, but commonly occurs also in elements that convert light to electricity, such as organic thin-film solar cell and solid-state sensors.

CITATION LIST

Patent Literatures

Patent Literature 1: Japanese Patent Application Laid-Open (JP-A) No. 2006-331695
Patent Literature 2: JP-A No. 2008-10211
Patent Literature 3: JP-A No. 2008-34142
Patent Literature 4: JP-A No. 2008-181832
Patent Literature 5: JP-A No. 2006-331694

SUMMARY OF INVENTION

Technical Problem

Conventionally, when an EL element is encapsulated by a sealing member or a sealing structure, a sealing member is affixed to the EL element using an adhesive, or members constituting a sealing structure are sequentially formed on the EL element. However, in the case of a sealing member, an adhesive is applied on a sealing member or an EL element, the sealing member is affixed to the EL element, and then the adhesive is cured. Also, in the case of a sealing structure, an adhesive is applied on an EL element, a sealing structure is formed on the EL element, and then the adhesive is cured. Therefore, the production process is complicated.

The present invention was made in view of such circumstances, and it is a main object of the invention to provide a heat-conductive sealing member which has high moisture barrier properties, has heat dissipation properties, and is capable of encapsulating an element by a simple method.

Solution to Problem

In order to achieve the object described above, the present invention provides a heat-conductive sealing member comprising: a metal base material; an insulating layer that is formed on the metal base material, has heat conductivity, and contains at least polyimide; and a tacky adhesive layer that is formed on the insulating layer and has heat resistance.

According to the present invention, since a tacky adhesive layer is formed, when the tacky adhesive layer of the heat-conductive sealing member is affixed to an object to be encapsulated such as an EL element, the tacky adhesive layer conforms to the irregularities of the object to be encapsulated, and the heat-conductive sealing member and the object to be encapsulated can be closely adhered. Therefore, it is possible to encapsulate an object to be encapsulated by a simple method, without requiring complicated processes. According to the present invention, since an insulating layer containing polyimide, which has relatively higher heat conductivity among resins, is formed on a metal base material having excellent heat conductivity and gas barrier properties, high moisture barrier properties are exhibited, and also, heat can be rapidly conducted or dissipated. Therefore, for example, when the sealing member is used in an EL element, the luminescence characteristics can be maintained stably for a long time period, and also, uniform light emission without emission unevenness can be realized, while shortening of the service life or destruction of the element can be reduced.

According to the present invention, it is preferable that the insulating layer contains the polyimide as a main component. By incorporating polyimide as a main component, an insulating layer having excellent insulation properties and heat resistance can be obtained. Particularly, when polyimide is incorporated as a main component, thickness reduction of the insulating layer can be achieved, and the heat conductivity of the insulating layer is enhanced. Thus, a heat-conductive sealing member having superior heat conductivity can be obtained.

Also, according to the present invention, it is preferable that a peeling layer be formed on the tacky adhesive layer. It is because handling of the heat-conductive sealing member of the present invention is facilitated.

In the case such as described above, it is preferable that the peeling layer has gas barrier properties. It is because the heat-conductive sealing member of the present invention acquires improved storage stability.

Furthermore, according to the present invention, it is preferable that the thickness of the insulating layer be in the range of 0.5 μm to 100 μm. It is because if the thickness of the insulating layer is too small, there is a risk that insulating properties may deteriorate, and if the thickness is too large, there is a risk that heat conductivity may deteriorate.

Also, according to the present invention, it is preferable that the coefficient of hygroscopic expansion of the insulating layer be in the range of 0 ppm/% RH to 15 ppm/% RH. It is because it is preferable for the insulating layer to have low water absorbency.

According to the present invention, it is preferable that the coefficient of linear thermal expansion of the insulating layer be in the range of 0 ppm/° C. to 30 ppm/° C. It is because when the coefficient of linear thermal expansion of the insulating layer is in the range described above, the coefficients of linear thermal expansion of the insulating layer and the metal base material may be adjusted to be close to each other, so that warpage of the heat-conductive sealing member can be suppressed, and also, the adhesiveness between the insulating layer and the metal base material can be increased.

Furthermore, according to the present invention, it is preferable that the difference between the coefficient of linear thermal expansion of the insulating layer and the coefficient of linear thermal expansion of the metal base material be 15 ppm/° C. or less. As described above, it is because, as the coefficients of linear thermal expansion of the insulating layer and the metal base material are closer to each other, warpage of the heat-conductive sealing member can be suppressed, and also, the adhesiveness between the insulating layer and the metal base material is increased.

According to the present invention, it is preferable that the 5% weight loss temperature of the tacky adhesive constituting the tacky adhesive layer be 80° C. or higher. By utilizing a tacky adhesive having high heat resistance such as described above, when an EL element is produced using the heat-conductive sealing member of the present invention, deterioration of the element due to the outgas or thermal decomposition products generated from the tacky adhesive layer can be reduced.

Furthermore, according to the present invention, it is preferable that the tacky adhesive layer contains a curable tacky adhesive layer. When an EL element is produced using the heat-conductive sealing member of the present invention, since a curable tacky adhesive exhibits tacky adhesiveness during the production of element and slowly cures after the element production, it is possible to obtain an EL element which is well-balanced between workability and element stability.

Also, according to the present invention, it is preferable that the tacky adhesive layer contains a polyimide-based resin. It is because polyimide-based resins have excellent heat resistance and heat conductivity.

According to the present invention, the tacky adhesive layer may contain an acrylic resin. Acrylic resins are general-purpose adhesives having relatively high heat resistance, and are advantageous in terms of cost. Also, since acrylic resins have particularly high general-purpose usability, and a large number of commercially available products and developed products are available, selection of the acrylic resin can be made in accordance with the intended characteristics.

Furthermore, the tacky adhesive layer may contain a polyester resin. Polyester resins are advantageous in that they have higher heat resistance and tacky adhesiveness than acrylic resins.

In addition, the tacky adhesive layer may also contain a silicone resin. Silicone resins are advantageous in that they have higher heat resistance than acrylic resins.

Furthermore, according to the present invention, it is preferable that the glass transition temperature (Tg) of the tacky adhesive constituting the tacky adhesive layer be 100° C. or lower. It is because if Tg is high, when the heat-conductive sealing member of the present invention is affixed to an object to be encapsulated, it is difficult for the tacky adhesive layer to conform to the irregularities of the object to be encapsulated.

Also, according to the present invention, it is preferable that the storage modulus at room temperature of the tacky adhesive layer be from $1.0 \times 10^2$ Pa to $1.0 \times 10^7$ Pa. When the storage modulus at room temperature of the tacky adhesive layer is in the range described above, practically sufficient tacky adhesiveness and satisfactory conformity to the s irregularities are obtained. If the storage modulus at room temperature is smaller than the range described above, the tacky adhesive layer becomes brittle, and cohesive failure is likely to occur. On the other hand, if the storage modulus at room temperature is larger than the range, sufficient conformity to the irregularities is not easily manifested.

According to the present invention, the tacky adhesive layer may contain a moisture absorbent. It is because the penetration of moisture from the outside can be more effectively prevented through the moisture absorption by the moisture absorbent in the insulating layer.

According to the present invention, it is preferable that the surface of the metal base material on which the insulating layer and the tacky adhesive layer are formed, has a metal base material-exposed region where the insulating layer and the tacky adhesive layer are absent and the metal base material is exposed. If there is such a metal base material-exposed region, when an EL element is encapsulated using the heat-conductive sealing member of the present invention, a sealing resin section can be closely adhered to the metal base material without inserting an insulating layer or a tacky adhesive layer therebetween, and thus, penetration of moisture into the EL element can be more strongly prevented. Furthermore, when a sealing resin section is selectively formed on the metal base material-exposed region, it is possible to compartmentalize the EL element in plane or to encapsulate the organic EL display apparatus in a multi-faceted state. Thus, it is advantageous that elements can be produced stably with high productivity. Also, the metal base material-exposed region can serve as a through-hole intended for penetrating through the insulating layer and the tacky adhesive layer and achieving electrical conduction to the metal base material.

In this case, it is preferable that the insulating layer be formed in an area excluding the outer peripheral area of the metal base material. For example, when an EL element is produced using the heat-conductive sealing member of the present invention, if the insulating layer is formed over the entire surface of the metal base material and the cross-section of the insulating layer is exposed, since polyimides generally exhibit hygroscopic properties, there is a risk that moisture may penetrates into the inside of the element through the cross-section of the insulating layer at the time of production or at the time of driving, and the element performance may deteriorate. Therefore, in order to achieve encapsulation of the element without exposing the cross-section of the insulating layer, the insulating layer is preferably not formed in the outer peripheral area of the metal base material.

In the case described above, the tacky adhesive layer may be formed in an area excluding the outer peripheral area of the metal base material. When the tacky adhesive layer does not contain a moisture absorbent that will be described later, it is preferable that the tacky adhesive layer be formed in the area excluding the outer peripheral area of the metal base material, in order to prevent the penetration of moisture through the cross-section of the tacky adhesive layer.

Furthermore, in the case described above, a moisture-proof section may be formed in the outer peripheral area of the metal base material. It is because the penetration of moisture from the outside can be effectively prevented.

In this case, it is preferable that the water vapor permeability of the moisture-proof section be $1.0 \times 10^{-1}$ g/m$^2$/day or less.

Furthermore, according to the present invention, it is preferable that the metal base material has irregularities on the surface that is brought into contact with air. It is because heat diffusion is ameliorated, and heat dissipation properties can be increased.

The present invention also provides an EL element comprising: a transparent substrate; a transparent electrode layer formed on the transparent substrate; an EL layer formed on the transparent electrode layer and including at least a light emitting layer; a back surface electrode layer formed on the EL layer; and a heat-conductive sealing member formed to cover the transparent electrode layer, the EL layer and the back surface electrode layer, and is characterized in that the heat-conductive sealing member comprises: a metal base material, an insulating layer that is formed on the metal base material, has heat conductivity and contains at least polyimide, and a tacky adhesive layer that is formed on the insulating layer and has heat resistance, and that the tacky adhesive layer is adhered to the transparent substrate so as to cover the transparent electrode layer, the EL layer and the back surface electrode layer.

According to the present invention, since the tacky adhesive layer is adhered to the transparent substrate so as to cover the transparent electrode layer, the EL layer and the back surface electrode layer, and the tacky adhesive layer conforms to the level differences caused by the transparent electrode layer, the EL layer and the back surface electrode layer, the heat-conductive sealing member can be closely adhered substantially without having air layers (gas layers) interposed therebetween. Therefore, an EL element can be encapsulated by a simple method without requiring any complicated process.

In regard to the invention described above, it is preferable that a sealing resin section be formed on the transparent substrate so as to surround the outer boundary of the heat-conductive sealing member. It is because the penetration of moisture from the outside can be effectively prevented.

In the case described above, the sealing resin section may contain a moisture absorbent. It is because the penetration of moisture from the outside can be more effectively prevented through the moisture absorption by the moisture absorbent in the sealing resin section.

Furthermore, according to the present invention, the back surface electrode layer may have transparency, and a white light reflective layer may be formed between the back surface electrode layer and the heat-conductive sealing member. It is because the light emitted from the EL layer can be diffused and reflected by the white light reflective layer, and the angle-dependency of the emitted light color can be mitigated by the interference effect.

Advantageous Effects of Invention

According to the present invention, there is provided an effect that an EL element can be conveniently encapsulated because a predetermined insulating layer and a predetermined tacky adhesive layer are laminated on a metal base material.

BRIEF DESCRIPTION OF DRAWINGS

FIGS. 13A and 13B are a set of photographs after a lapse of 200 hours in a high-temperature storage test at 80° C. of organic EL elements produced in Examples.

FIGS. 14A and 14B are a set of photographs after a lapse of 200 hours in a high-temperature storage test at 80° C. of organic EL elements produced in Examples.

DESCRIPTION OF EMBODIMENTS

Hereinafter, the heat-conductive sealing member and EL element of the present invention will be described in detail.

A. Heat-Conductive Sealing Member

First, the heat-conductive sealing member of the present invention will be explained.

The heat-conductive sealing member of the present invention comprises: a metal base material; an insulating layer that is formed on the metal base material, has heat conductivity and contains at least polyimide; and a tacky adhesive layer that is formed on the insulating layer and has heat resistance.

The heat-conductive sealing member of the present invention will be explained while making reference to the attached drawings.

Figure 1:
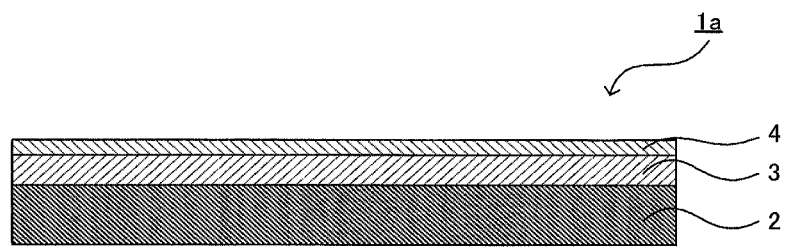
FIG. 1 is a schematic cross-sectional diagram showing an example of the heat-conductive sealing member of the present invention.

FIG. 1 is a schematic cross-sectional diagram showing an example of the heat-conductive sealing member of the present invention. The heat-conductive sealing member 1a illustrated in FIG. 1 comprises: a metal base material 2; an insulating layer 3 that is formed on the metal base material 2, has heat conductivity, and contains at least polyimide; and a tacky adhesive layer 4 that is formed on the insulating layer 3 and has heat resistance.

Figure 2:
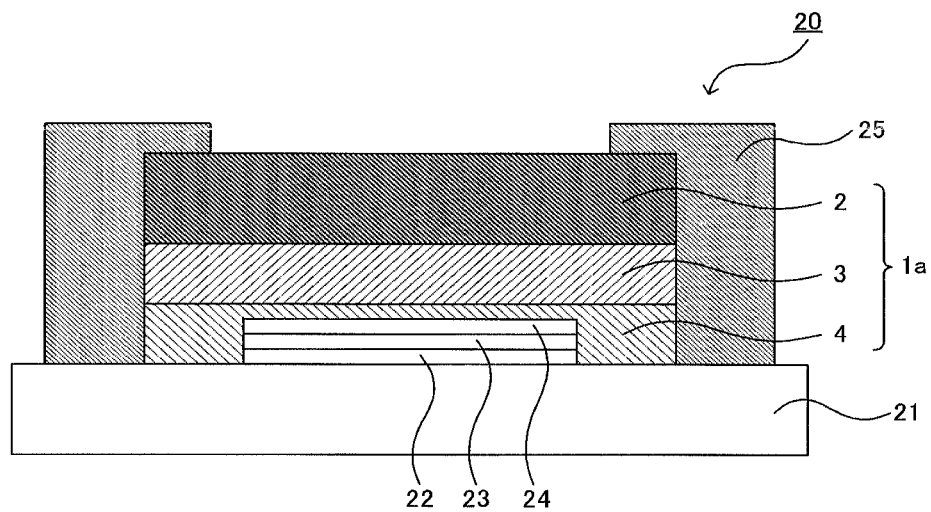
FIG. 2 is a schematic cross-sectional diagram showing an example of the EL element of the present invention.

FIG. 2 is a schematic cross-sectional diagram showing an example of an EL element encapsulated using the heat-conductive sealing member of the present invention. The EL element 20 illustrated in FIG. 2 comprises: a transparent substrate 21; a transparent electrode layer 22 formed on the transparent substrate 21; an EL layer 23 formed on the transparent electrode layer 22 and has at least a light emitting layer; a back surface electrode layer 24 formed on the EL layer 23; a heat-conductive sealing member 1a formed so as to cover the transparent electrode layer 22, the EL layer 23 and the back surface electrode layer 24; and a sealing resin section 25 formed on the transparent substrate 21 so as to surround the outer boundary of the heat-conductive sealing member 1a, and the tacky adhesive layer 4 of the heat-conductive sealing member 1a is adhered to the transparent substrate 21 so as to cover the transparent electrode layer 22, the EL layer 23 and the back surface electrode layer 24.

Generally, the metal base materials have excellent heat conductivity and gas barrier properties. Furthermore, the insulating layer contains polyimide, and generally polyimides have relatively higher heat conductivity among resins, although their heat conductivity is still lower when compared to metals. Furthermore, the tacky adhesive used in the tacky adhesive layer has inferior heat conductivity as compared with metals or polyimides, but has higher heat conductivity than air. Also, the tacky adhesive is flexible even at room temperature, has high conformity to the irregularities, and can be closely adhered to an EL element having irregularities on the surface. The tacky adhesive layer accomplishes the role of more efficiently transferring the heat generated from the light emitting layer to the metal base material. Therefore, the heat-conductive sealing member of the present invention has high moisture barrier properties, and also can rapidly conduct or dissipate heat.

When an EL element, for example, is encapsulated using the heat conductive sealing member of the present invention as such, as the tacky adhesive layer of the heat-conductive sealing member is affixed to the transparent substrate that supports the EL element, the tacky adhesive layer conforms to the level differences caused by the transparent electrode layer, the EL layer and the back surface electrode layer, and the tacky adhesive layer is adhered to the transparent substrate so as to cover the transparent electrode layer, the EL layer and the back surface electrode layer. Thus, there is no gap existing between the heat-conductive sealing member and the transparent substrate. Therefore, high heat conductivity is obtained, the adverse effects due to heat generation can be suppressed, uniform light emission without emission unevenness can be realized, and shortening of the service life or destruction of the element can be reduced. Furthermore, in this case, since the heat-conductive sealing member has excellent gas barrier properties, the permeation of moisture through the heat-conductive sealing member side can be reduced, and the luminescence characteristics can be maintained stably over a long time period.

As such, according to the present invention, a heat-conductive sealing member and a transparent substrate on which a transparent electrode layer, an EL layer and a back surface electrode layer are laminated can be closely adhered by affixing the tacky adhesive layer of the heat-conductive sealing member to the transparent substrate that supports an EL element, and thus, an EL element can be encapsulated by a simple method without requiring complicated processes. Furthermore, according to the present invention, since the tacky adhesive layer of the heat-conductive sealing member can be affixed to the transparent substrate that supports an EL element at a low temperature such as room temperature, the present invention is advantageous in that the present invention is favorable to the encapsulation of EL elements that are vulnerable to heat, and handling is easy.

Furthermore, according to the present invention, the insulating layer is formed from polyimide, and polyimides generally have excellent heat resistance. Also, the tacky adhesive layer has heat resistance. That is to say, in the heat-conductive sealing member of the present invention, both the insulating layer and the tacky adhesive layer have heat resistance. Therefore, when an EL element, for example, is encapsulated using the heat-conductive sealing member of the present invention, deterioration of the insulating layer and the tacky adhesive layer due to heat generation can be suppressed.

Figure 3:
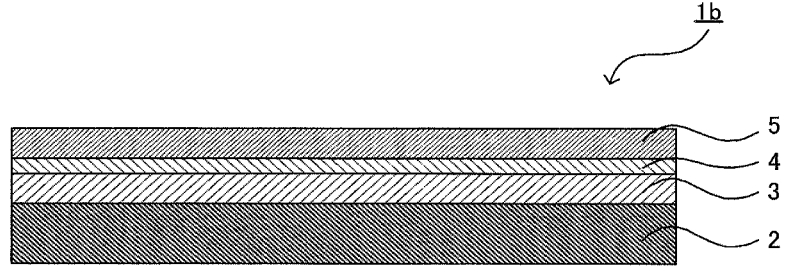
FIG. 3 is a schematic cross-sectional diagram showing another example of the heat-conductive sealing member of the present invention.

FIG. 3 is a schematic cross-sectional diagram showing another example of the heat-conductive sealing member of the present invention. The heat-conductive sealing member 1b illustrated in FIG. 3 comprises: a metal base material 2; an insulating layer 3 that is formed on the metal base material 2, has heat conductivity, and contains at least polyimide; a tacky adhesive layer 4 that is formed on the insulating layer 3 and has heat resistance; and a peeling layer 5 formed on the tacky adhesive layer 4.

According to the present invention, a peeling layer may be formed, as illustrated in FIG. 3. In this case as well, the EL element 20 can be encapsulated as illustrated in FIG. 2, by peeling the peeling layer from the heat-conductive sealing member to expose the tacky adhesive layer, and affixing the tacky adhesive layer of the heat-conductive sealing member to the transparent substrate that supports the EL element.

Hereinafter, various configurations of the heat-conductive sealing member of the present invention will be explained.

1. Insulating Layer

The insulating layer according to the present invention is characterized in that the layer is formed on a metal base material, has heat conductivity, and contains at least polyimide.

The insulating layer has insulating properties. Specifically, the volume resistance of the insulating layer is preferably $1.0 \times 10^9$ $\Omega \cdot m$ or greater, more preferably $1.0 \times 10^{10}$ $\Omega \cdot m$ or greater, and even more preferably $1.0 \times 10^{11}$ $\Omega \cdot m$ or greater.

Meanwhile, the volume resistance can be measured by techniques equivalent to the standard methods such as JIS K6911, JIS C2318 and ASTM D257.

Furthermore, the insulating layer has heat conductivity. Specifically, the insulating layer contains polyimide, and the heat conductivity of the insulating layer is usually about 0.1 W/mK to 1.0 W/mK. Higher heat conductivity is more preferable. Higher heat conductivity results in superior heat conductibility, when a comparison is made between films having the same thickness.

Meanwhile, the heat conductivity can be measured by a laser flash method, a hot wire method, a plate heat flow meter method, a temperature gradient method or the like, and the method may be appropriately selected in accordance with the material of the insulating layer.

The insulating layer contains polyimide, and preferably contains polyimide as a main component. Generally, polyimides have water absorbency. Since many of semiconductor materials used in EL elements, organic thin film solar cells, solid-state sensors and the like are vulnerable to moisture, it is preferable that the insulating layer have relatively low water absorbency, in order to reduce moisture inside the element. As one of the indices for water absorbency, there is available the coefficient of hygroscopic expansion. Therefore, a smaller coefficient of hygroscopic expansion of the insulating layer is more preferable, and specifically, the coefficient of hygroscopic expansion is preferably in the range of 0 ppm/% RH to 15 ppm/% RH, more preferably in the range of 0 ppm/% RH to 12 ppm/% RH, and even more preferably in the range of 0 ppm/% RH to 10 ppm/% RH. When the coefficient of hygroscopic expansion of the insulating layer is in the range described above, the water absorbency of the insulating layer can be made sufficiently small, and storage of the heat-conductive sealing member is facilitated. When an EL element, for example, is encapsulated using the heat-conductive sealing member, the process is simplified. Furthermore, as the coefficient of hygroscopic expansion of the insulating layer is smaller, the dimensional stability of the insulating layer is enhanced. If the coefficient of hygroscopic expansion of the insulating layer is large, due to the difference in the expansion ratio with the metal base material whose coefficient of hygroscopic expansion is almost close to zero, the heat-conductive sealing member may be warped along with an increase in the humidity, or the adhesiveness between the insulating layer and the metal base material may decrease.

Meanwhile, the coefficient of hygroscopic expansion is measured as follows. First, a film of the insulating layer only is produced. The method for producing an insulating layer film may be: a method of producing an insulating layer film on a heat resistant film (Upilex S 50S™ (manufactured by Ube Industries, Ltd.)) or a glass substrate, and then detaching the insulating layer film; or a method of producing an insulating layer film on a metal substrate, and then removing the metal by etching to obtain an insulating layer film. Subsequently, the insulating layer film thus obtained is cut to a size of 5 mm in width×20 mm in length, and this is used as an evaluation sample. The coefficient of hygroscopic expansion is measured with an adjustable humidity mechanical analyzer (Thermo Plus TMA8310™ (manufactured by Rigaku Corp.)). For example, the temperature is set constant at 25° C., and first, a sample is brought to a stabilized state in an environment at a humidity of 15% RH and is maintained in that state for approximately 30 minutes to 2 hours. Subsequently, the humidity of the measurement site is adjusted to 20% RH, and the sample is maintained in that state for 30 minutes to 2 hours until the sample is stabilized. Thereafter, the humidity is changed to 50% RH, and the difference between the sample length obtainable when the sample is stabilized at the humidity and the sample length obtainable when the sample is stabilized at 20% RH is determined. The value calculated by dividing the difference of sample length by the change of humidity (in this case, 50−20=30), and dividing this value by the sample length, is designated as the coefficient of hygroscopic expansion (C.H.E.). At the time of measurement, the tensile load is set to 1 g/25,000 $\mu m^2$ so that the load per cross-sectional area of the evaluation sample is uniform.

Furthermore, from the viewpoint of dimensional stability, the coefficient of linear thermal expansion of the insulating layer is preferably such that the difference with the coefficient of linear thermal expansion of the metal base material is 15 ppm/° C. or less, more preferably 10 ppm/° C. or less, and even more preferably 5 ppm/° C. or less. As the coefficients of linear thermal expansion of the insulating layer and the metal base material are closer to each other, warpage of the heat-conductive sealing member is suppressed, and also, when the thermal environment of the heat-conductive sealing member is changed, the stress at the interface between the insulating layer and the metal base material is decreased, so that adhesiveness is enhanced. Also, it is preferable that the heat-conductive sealing member of the present invention remain flat in an environment at a temperature in the range of 0° C. to 100° C. upon handling; however, if the coefficients of linear thermal expansion of the insulating layer and the metal base material differ from each other to a large extent, the heat-conductive sealing member is warped as a result of changes in the thermal environment.

Meanwhile, the phrase "the heat-conductive sealing member is flat" implies that when a sample is obtained by cutting the heat-conductive sealing member into a strip having a size of 10 mm in width and 50 mm in length, and one of the short edges of the sample thus obtained is fixed on a horizontally smooth platform, the levitation distance of the other short edge of the sample from the surface of the platform is 1.0 mm or less.

Specifically, the coefficient of linear thermal expansion of the insulating layer is preferably in the range of 0 ppm/° C. to 30 ppm/° C., more preferably in the range of 0 ppm/° C. to 25 ppm/° C., and even more preferably in the range of 0 ppm/° C. to 10 ppm/° C., from the viewpoint of dimensional stability.

Meanwhile, the coefficient of linear thermal expansion is measured as follows. First, a film of the insulating layer only is produced. The method for producing an insulating layer film is as described above. Subsequently, the insulating layer film thus obtained is cut to a size of 5 mm in width×20 mm in length, and this is used as an evaluation sample. The coefficient of linear thermal expansion is measured with a thermomechanical analyzer (for example, Thermo Plus TMA8310™ (manufactured by Rigaku Corp.)). For the measurement conditions, the rate of temperature increase is set to 10° C./min, and the tensile load is set to 1 g/25,000 $\mu m^2$ so that the load per cross-sectional area of the evaluation sample is uniform. The average coefficient of linear thermal expansion in the temperature range of 100° C. to 200° C. is designated as the coefficient of linear thermal expansion (C.T.E.).

The polyimide that constitutes the insulating layer is not particularly limited as long as it satisfies the characteristics described above. For example, it is possible to control insulation properties and heat conductivity or to control the coefficient of hygroscopic expansion or the coefficient of linear thermal expansion by appropriately selecting the structure of the polyimide.

The polyimide is preferably polyimide containing an aromatic skeleton, from the viewpoint of adjusting the coefficient of linear thermal expansion, the coefficient of hygroscopic expansion and the heat conductivity of the insulating layer to be suitable for the heat-conductive sealing member of the present invention. Among polyimides, polyimide containing an aromatic skeleton is derived from a rigid skeleton having high planarity, and thereby, such polyimide has excellent heat resistance and insulation properties as a thin film, has high heat conductivity and has a low coefficient of linear thermal expansion. Therefore, such polyimide is used with preference in the insulating layer of the heat-conductive sealing member of the present invention.

Since it is demanded that the polyimide exhibit low hygroscopic expansion and low linear thermal expansion, polyimide having a repeating unit represented by the following formula (I) is preferred. Such polyimide exhibits high heat resistance and insulation properties originating from its rigid skeleton, and also exhibits linear thermal expansion that is equivalent to that of a metal. Also, the coefficient of hygroscopic expansion can be made small.

[Chemical Formula 1]

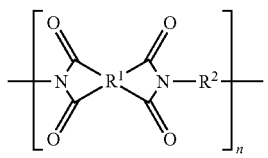

(I)

In the formula (I), $R^1$ represents a tetravalent organic group; $R^2$ represents a divalent organic group; repeating $R^1$s and $R^2$s may be respectively identical with or different from each other; and "n" represents a natural number of 1 or greater.

In the formula (I), generally, $R^1$ is a structure derived from a tetracarboxylic acid dianhydride, and $R^2$ is a structure derived from a diamine.

Examples of the tetracarboxylic acid dianhydride that can be applied to the polyimide include such as ethylenetetracarboxylic acid dianhydride, butanetetracarboxylic acid dianhydride, cyclobutanetetracarboxylic acid dianhydride, cyclopentanetetracarboxylic acid dianhydride, pyromellitic dianhydride, 3,3',4,4'-benzophenonetetracarboxylic acid dianhydride, 2,2',3,3'-benzophenonetetracarboxylic acid dianhydride, 3,3',4,4'-biphenyltetracarboxylic acid dianhydride, 2,2',3,3'-biphenyltetracarboxylic acid dianhydride, 2,2',6,6'-biphenyltetracarboxylic acid dianhydride, 2,2-bis(3,4-dicarboxyphenyl)propane dianhydride, 2,2-bis(2,3-dicarboxyphenyl)propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)phenoxy]phenyl}propane dianhydride, 2,2-bis{4-[3-(1,2-dicarboxy)phenoxy]phenyl}propane dianhydride, bis{4-[4-(1,2-dicarboxy)phenoxy]phenyl}ketone dianhydride, bis{4-[3-(1,2-dicarboxy)phenoxy]phenyl}ketone dianhydride, 4,4'-bis[4-(1,2-dicarboxy)phenoxy]biphenyl dianhydride, 4,4'-bis[3-(1,2-dicarboxy)phenoxy]biphenyl dianhydride, bis{4-[4-(1,2-dicarboxy)phenoxy]phenyl}ketone dianhydride, bis{4-[3-(1,2-dicarboxy)phenoxy]phenyl}ketone dianhydride, bis{4-[4-(1,2-dicarboxy)phenoxy]phenyl}sulfone dianhydride, bis{4-[3-(1,2-dicarboxy)phenoxy]phenyl}sulfone dianhydride, bis{4-[4-(1,2-dicarboxy)phenoxy]phenyl}sulfide dianhydride, bis{4-[3-(1,2-dicarboxy)phenoxy]phenyl}sulfide dianhydride, 2,2-bis{4-[4-(1,2-dicarboxy)phenoxy]phenyl}-1,1,1,3,3,3-hexafluoropropane dianhydride, 2,2-bis{4-[3-(1,2-dicarboxy)phenoxy]phenyl}-1,1,1,3,3,3-pro pane dianhydride, 2,3,6,7-naphthalenetetracarboxylic acid dianhydride, 1,4,5,8-naphthalenetetracarboxylic acid dianhydride, 1,2,5,6-naphthalenetetracarboxylic acid dianhydride, 1,2,3,4-benzenetetracarboxylic acid dianhydride, 3,4,9,10-perylenetetracarboxylic acid dianhydride, 2,3,6,7-anthracenetetracarboxylic acid dianhydride, and 1,2,7,8-phenanthrenetetracarboxylic acid dianhydride.

These are used singly or as mixtures of two or more kinds.

A tetracarboxylic acid dianhydride that is used with preference from the viewpoints of the heat resistance, the coefficient of linear thermal expansion and the like of the polyimide, is an aromatic tetracarboxylic acid dianhydride. Examples of a tetracarboxylic acid dianhydride that are particularly preferably used include pyromellitic dianhydride, mellophanic dianhydride, 3,3',4,4'-benzophenonetetracarboxylic acid dianhydride, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, 2,2',6,6'-biphenyltetracarboxylic acid dianhydride, bis(3,4-dicarboxyphenyl)ether dianhydride, 2,2-bis(3,4-dicarboxyphenyl)-1,1,1,3,3,3-hexafluoropropane dianhydride, and bis(3,4-dicarboxyphenyl)ether dianhydride.

Among them, from the viewpoint of decreasing the coefficient of hygroscopic expansion, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, and bis(3,4-dicarboxyphenyl)ether dianhydride are particularly preferred.

When a tetracarboxylic acid dianhydride having fluorine introduced therein is used as a tetracarboxylic acid dianhydride to be used in combination, the coefficient of hygroscopic expansion of the polyimide is decreased. However, a polyimide precursor having a skeleton containing fluorine does not easily dissolve into a basic aqueous solution, and it is needed to perform development with a mixed solution of an organic solvent such as alcohol and a basic aqueous solution.

Furthermore, when a rigid tetracarboxylic acid dianhydride such as pyromellitic dianhydride, mellophanic dianhydride, 3,3',4,4'-biphenyltetracarboxylic acid dianhydride, 2,3,3',4'-biphenyltetracarboxylic acid dianhydride, 2,3,2',3'-biphenyltetracarboxylic acid dianhydride, or 1,4,5,8-naphthalenetetracarboxylic acid dianhydride is used, the coefficient of linear thermal expansion of the polyimide is decreased, which is preferable. Among them, from the viewpoint of the balance between the coefficient of linear thermal expansion and the coefficient of hygroscopic expansion, 3,3',4,4'-biphenyltetracarboxylic acid dianhydride, 2,3,3',4'-biphenyltetracarboxylic acid dianhydride, and 2,3,2',3'-biphenyltetracarboxylic acid dianhydride are particularly preferred.

When the tetracarboxylic acid dianhydride has an alicyclic skeleton, transparency of the polyimide precursor is enhanced, and therefore, a photosensitive polyimide precursor having high sensitivity is obtained. On the other hand, the resulting polyimide tends to have inferior heat resistance and insulation properties as compared with aromatic polyimides.

When an aromatic tetracarboxylic acid dianhydride is used, there is an advantage that polyimide exhibiting excellent heat resistance and a low coefficient of linear thermal expansion is obtained. Therefore, in regard to the polyimide, it is preferable that 33 mol % or more of $R^1$s in the formula (I) have any of the structures represented by the following formulas:

[Chemical Formula 2]

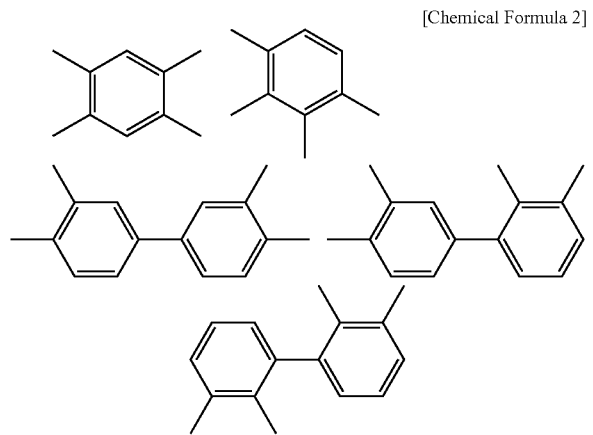

If the polyimide contains any of the structures of the formulas shown above, the polyimide exhibits low linear thermal expansion and low hygroscopic expansion due to these rigid skeletons. Also, it is advantageous that such polyimides are easily commercially available, and less expensive.

Polyimide having a structure such as described above is polyimide exhibiting high heat resistance and a low coefficient of linear thermal expansion. Accordingly, it is more preferable if the content of the structure represented by the formula described above is closer to 100 mol % of $R^1$s in the formula (I), but it is acceptable if the polyimide contains the structure at least in an amount of 33% or more of $R^1$s in the formula (I). Among others, the content of the structure represented by the formula described above is preferably 50 mol % or more, and more preferably 70 mol % or more, of $R^1$s in the formula (I).

On the other hand, the diamine component that can be applied to the polyimide can also be used such that one kind of diamine may be used alone, or two or more kinds of diamines may be used in combination. There are no particular limitations on the diamine component to be used, and examples include p-phenylenediamine, m-phenylendiamine, o-phenylenediamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethylbenzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxy)phenyl]sulfide, bis[4-(4-aminophenoxy)phenyl]sulfide, bis[4-(3-aminophenoxy)phenyl]sulfone, bis[4-(4-aminophenoxy)phenyl]sulfone, bis[4-(3-aminophenoxy)phenyl]ether, bis[4-(4-aminophenoxy)phenyl]ether, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis-[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxy)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy] diphenylsulfone, 4,4'-bis[4-(4-aminophenoxy)phenoxy] diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobi indane, 6,6'-bis(4-aminophenoxy)-3,3,3',3'-tetramethyl-1,1'-spirobi indane, 1,3-bis(3-aminopropyl)tetramethyldisiloxane, 1,3-bis(4-aminobutyl)tetramethyldisiloxane, α,ω-bis(3-aminopropyl)polydimethylsiloxane, α,ω-bis(3-aminobutyl)polydimethylsiloxane, bis(aminomethyl) ether, bis(2-aminoethyl)ether, bis(3-aminopropyl)ether, bis(2-aminomethoxy)ethyl]ether, bis[2-(2-aminoethoxy)ethyl]ether, bis[2-(3-aminoprothoxy)ethyl]ether, 1,2-bis(aminomethoxy)ethane, 1,2-bis(2-aminoethoxy)ethane, 1,2-bis[2-(aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,11-diaminoundecane, and 1,12-diaminododecane, 1,2-diaminocyclohexane, 1,3-diaminocyclohexane, 1,4-diaminocyclohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)bicyclo[2.2.1]heptane. Also, diamines in which a portion or all of the hydrogen atoms on the aromatic rings of the diamines described above have been substituted with substituents selected from a fluoro group, a methyl group, a methoxy group, a trifluoromethyl group, and a trifluoromethoxy group, can also be used.

Furthermore, according to the purpose, diamines in which a portion or all of the hydrogen atoms on the aromatic rings of the diamines described above have been substituted with any one kind or two or more kinds selected from an ethynyl group, a benzocyclobuten-4'-yl group, a vinyl group, an allyl group, a cyano group, an isocyanato group and an isopropenyl group which are cross-linking points, can also be used.

The diamine can be selected on the basis of intended properties, and when a rigid diamine such as p-phenylenediamine is used, the polyimide acquires a low coefficient of expansion. Examples of the rigid diamine include, as diamines in which two amino groups are bonded to the same aromatic ring, p-phenylenediamine, m-phenylenediamine, 1,4-diaminonaphthalene, 1,5-diaminonaphthalene, 2,6-diaminonaphthalene, 2,7-diaminonaphthalene, and 1,4-diaminoanthracene.

Furthermore, a diamine in which two or more aromatic rings are bonded through single bonds, and two or more amino groups are respectively bonded to different aromatic rings directly or as a part of a substituent, may be used, and examples include diamines represented by the following formula (II). Specific examples include benzidine.

[Chemical Formula 3]

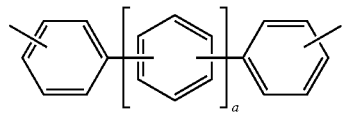

(II)

In the formula (II), "a" represents 0 or a natural number of 1 or greater; and the amino groups are bonded at the meta-position or the para-position relative to the bond between the benzene rings.

Furthermore, a diamine which has, in the formula (II), a substituent that is not involved in the bond with other benzene rings and is substituted at a position on a benzene ring where an amino group is not substituted, can also be used. These substituents are monovalent organic groups, and they may be bonded to each other. Specific examples include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4-diaminobiphenyl.

Also, when fluorine is introduced into the aromatic ring as a substituent, the coefficient of hygroscopic expansion can be lowered. However, a polyimide precursor, particularly polyamic acid, containing fluorine does not easily dissolve into a basic aqueous solution, and when the insulating layer is partially formed on the metal base material, it may be necessary to perform development using a mixed solution with an organic solvent such as alcohol, at the time of processing the insulating layer.

On the other hand, when diamine having a siloxane skeleton such as 1,3-bis(3-aminopropyl)tetramethyldisiloxane is used as the diamine, the adhesiveness to the metal base material may be improved, or the elastic modulus of the polyimide may decrease, so that the glass transition temperature may be lowered.

Here, the diamine to be selected is preferably aromatic diamine from the viewpoint of heat resistance, but in accordance with the intended properties, diamine other than aromatic diamine, such as aliphatic diamine or siloxane-based diamine, may also be used to the extent that does not exceed 60 mol %, and preferably 40 mol %, of the total amount of the diamine.

In regard to the polyimide, it is preferable that 33 mol % or more of $R^2$s in the formula (I) has any of the structures represented by the following formula:

[Chemical Formula 4]

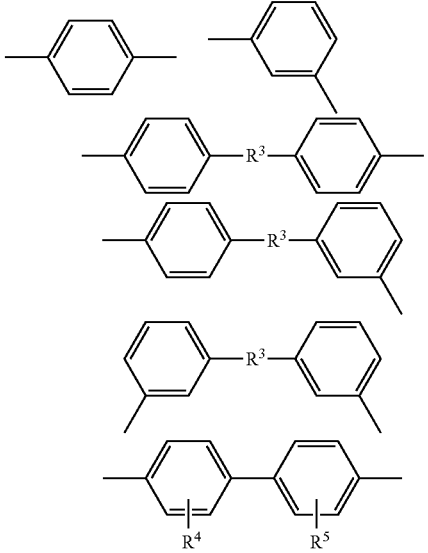

wherein $R^3$ represents a divalent organic group, an oxygen atom, a sulfur atom or a sulfone group; and $R^4$ and $R^5$ each represent a monovalent organic group or a halogen atom.

If the polyimide contains any of the structures of the formulas shown above, the polyimide exhibits low linear thermal expansion and low hygroscopic expansion due to those rigid skeletons. Also, it is advantageous that such polyimides are easily commercially available, and less expensive.

When the polyimide has a structure such as described above, heat resistance of the polyimide is enhanced, and the coefficient of linear thermal expansion is decreased. Accordingly, it is more preferable if the content of the structure represented by the formula described above is closer to 100 mol % of $R^2$s in the formula (I), but it is acceptable if the content of the structure is at least 33% or more of $R^2$s in the formula (I). Among others, the content of the structure represented by the formula described above is preferably 50 mol % or more, and more preferably 70 mol % or more, of $R^2$s in the formula (I).

According to the present invention, it is desirable that the insulating layer contains polyimide having a repeating unit represented by the formula (I) shown above, and if necessary, an appropriate laminate or combination of this polyimide with polyimide which exhibits different adhesiveness may also be used as the insulating layer.

Also, the polyimide having a repeating unit represented by the formula (I) may be photosensitive polyimide or polyimide obtainable by using a photosensitive polyimide precursor. Photosensitive polyimides can be obtained by using known techniques. For example, an ethylenic double bond is introduced into the carboxyl group of polyamic acid via an ester bond or an ionic bond to obtain a polyimide precursor, the resulting polyimide precursor is mixed with a photoradical initiator, and this mixture can be used as a solvent-developable negative type photosensitive polyimide precursor. Also, for example, a naphthoquinone diazide compound is added to polyamic acid or a partial esterification product thereof, and the mixture is used as an alkali-developable positive type photosensitive polyimide precursor. Alternatively, a photo base generator is added to polyamic acid, and the resulting mixture can be used as an alkali-developable negative type photosensitive polyimide precursor, such as by adding a nifedipine-based compound to polyamic acid, and using this mixture as an alkali-developable negative type photosensitive polyimide precursor.

These photosensitive polyimide precursors contain 15% to 35% of added photosensitivity-imparting components relative to the weight of the polyimide component. Accordingly, even if the polyimide is heated to 300° C. to 400° C. after pattern formation, residues originating from the photosensitivity-imparting components remain in the polyimide. Since these residues cause an increase in the coefficient of linear thermal expansion or the coefficient of hygroscopic expansion, when a photosensitive polyimide precursor is used, the reliability of the EL element tends to decrease as compared with the case where a non-photosensitive polyimide precursor is used. However, a photosensitive polyimide precursor prepared by adding a photo base generator to polyamic acid is capable of pattern formation, even if the amount of addition of the additive photo base generator is decreased to 15% or less. Therefore, such a photosensitive polyimide precursor is most preferable as a photosensitive polyimide precursor applicable to the present invention, because even after being converted to polyimide, there occurs less decomposition residue originating from the additive, deterioration of the characteristics such as the coefficient of linear thermal expansion or the coefficient of hygroscopic expansion is less, and less outgassing occurs.

It is preferable if the polyimide precursor used in the polyimide can be developed by a basic aqueous solution when the insulating layer is partially formed on the metal base material, from the viewpoints of securing safety of the work environment and reducing the process cost. The basic aqueous solution is available at low cost, and the cost for waste liquid treatment or the facility cost for securing work safety is low. Thus, production can be achieved at lower cost.

It is desirable that the insulating layer contains polyimide, but among others, it is preferable that the insulating layer contains polyimide as a main component. When polyimide is included as a main component, it is possible to obtain an insulating layer having excellent insulation properties and heat resistance. Particularly, when polyimide is included as a main component, thickness reduction of the insulating layer is made possible, and heat conductivity of the insulating layer is enhanced. Thus, a heat-conductive sealing member having excellent heat conductivity can be obtained.

Meanwhile, the phrase "the insulating layer contains polyimide as a main component" implies that the insulating layer contains polyimide to the extent that the characteristics described above are satisfied. Specifically, it means that the content of polyimide in the insulating layer is 75% by mass or greater, and preferably 90% by mass or greater, and it is particularly preferable that the insulating layer be composed only of polyimide. When the content of the polyimide in the insulating layer is in the range described above, the insulating layer can exhibit characteristics that are sufficient to achieve the objects of the present invention, and as the content of the polyimide increases, the characteristics intrinsic to the polyimide, such as heat resistance and insulation properties, are improved.

The insulating layer may also contain, if necessary, additives such as a leveling agent, a plasticizer, a surfactant and a defoamant.

The thickness of the insulating layer is not particularly limited as long as the insulating layer can have both insulation properties and heat conductivity, but specifically, the thickness is preferably in the range of 0.3 µm to 100 µm, more preferably in the range of 0.5 µm to 50 µm, and even more preferably in the range of 1 µm to 20 µm. It is because if the thickness of the insulating layer is too small, sufficient insulation properties may not be obtained, and if the thickness of the insulating layer is too large, there is a risk that heat conductivity may deteriorate.

The insulating layer may contain a moisture absorbent. It is because the penetration of moisture from the outside can be more effectively prevented through the moisture absorption by the moisture absorbent in the insulating layer. Thereby, when an EL element is produced using the heat-conductive sealing member of the present invention, deterioration of the element performance can be further suppressed.

The moisture absorbent is not particularly limited as long as it has at least a function of adsorbing moisture, but among others, the moisture absorbent is preferably a compound which is capable of chemically adsorbing moisture and also capable of maintaining the solid state even after adsorbing moisture. Examples of such a compound include metal oxides, and inorganic acid salts or organic acid salts of metals. Particularly, oxides and sulfates of alkaline earth metals are preferred. Examples of alkaline earth metal oxides include calcium oxide, barium oxide, magnesium oxide, and strontium oxide. Examples of sulfates include lithium sulfate, sodium sulfate, gallium sulfate, titanium sulfate, and nickel sulfate. Furthermore, silica gel, or organic compounds having moisture absorbency, such as polyvinyl alcohol can also be used. Among these, calcium oxide, barium oxide, and silica gel are particularly preferred. It is because these moisture absorbents have high hygroscopic properties.

The content of the moisture absorbent is not particularly limited, but the content is preferably in the range of 5 parts by mass to 80 parts by mass, more preferably in the range of 5 parts by mass to 60 parts by mass, and even more preferably in the range of 5 parts by mass to 50 parts by mass, relative to 100 parts by mass of the total amount of the moisture absorbent and the polyimide.

The insulating layer may be formed over the entire surface of the metal base material, or may also be partially formed on the metal base material. Inter alia, it is preferable that the insulating layer be partially formed on the metal base material. That is, it is preferable that the surface of the metal base material on which the insulating layer and the tacky adhesive layer are formed, have a metal base material-exposed region where the insulating layer and the tacky adhesive layer are absent and the metal base material is exposed. If there is such a metal base material-exposed region, when an EL element is encapsulated using the heat-conductive sealing member of the present invention, a sealing resin section can be closely adhered to the metal base material without inserting an insulating layer or a tacky adhesive layer therebetween, and thus, penetration of moisture into the EL element can be more strongly prevented. Furthermore, when a sealing resin section is selectively formed on the metal base material-exposed region, it is possible to compartmentalize the EL element in plane or to encapsulate the organic EL display apparatus in a multifaceted state. Thus, it is advantageous that elements can be produced stably with high productivity. Also, the metal base material-exposed region can serve as a through-hole intended for penetrating through the insulating layer and the tacky adhesive layer and achieving electrical conduction to the metal base material.

Figure 4A:
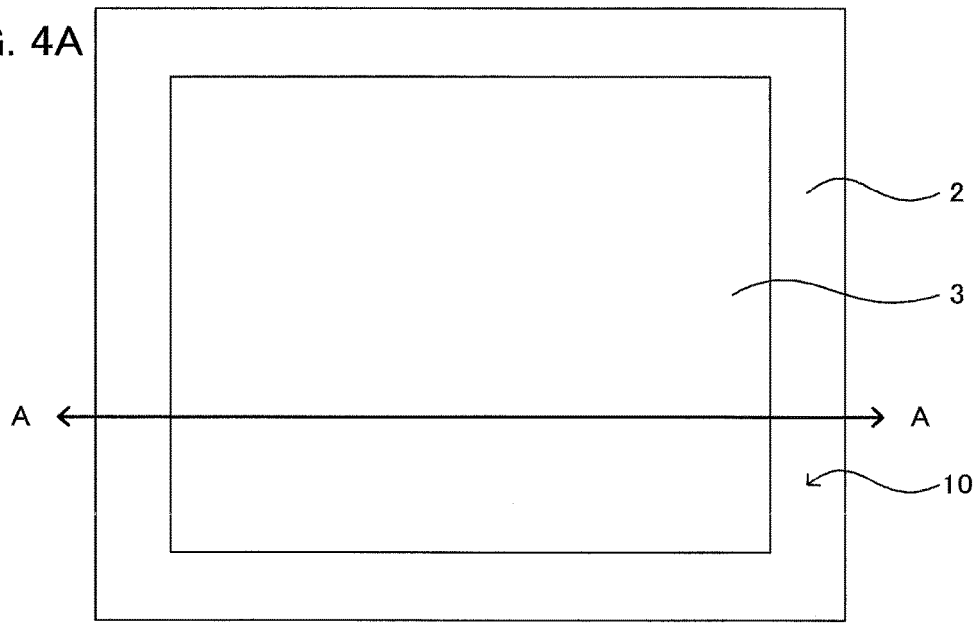
FIGS. 4A and 4B are a schematic top plan diagram and a schematic cross-sectional diagram showing yet another example of the heat conductive sealing member of the present invention.
Figure 4B:
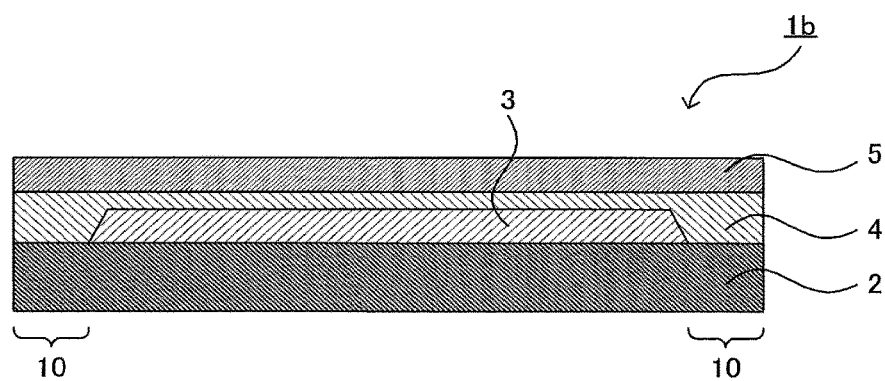

When the insulating layer is partially formed on the metal base material, inter alia, as illustrated in FIG. 4A and FIG. 4B, it is preferable that the insulating layer 3 be formed in an area excluding the outer peripheral area 10 of the metal base material 2. Meanwhile, FIG. 4A is a top plan diagram, and FIG. 4B is an A-A line cross-sectional diagram of FIG. 4A, and in FIG. 4A, the tacky adhesive layer and the peeling layer are not shown. When an EL element, for example, is produced using the heat-conductive sealing member of the present invention, if the insulating layer is formed over the entire surface of the metal base material so that the cross-sections of the insulating layer are exposed, since polyimides generally have relatively high water absorbency, there is a risk that moisture may penetrate into the element through the cross-sections of the insulating layer at the time of production or at the time of driving. This moisture may cause deterioration of the element performance or a change in the dimension of the insulating layer. Accordingly, it is preferable that the insulating layer be not formed at the outer peripheral areas of the metal base material, and that the portion in which the insulating layer containing polyimide is directly exposed to outside air, be reduced as much as possible.

As the method for forming the insulating layer, for example, a method of applying a polyimide solution or a polyimide precursor solution on the metal base material can be used. Among others, a method of applying a polyimide precursor solution is suitable. It is because polyimides have insufficient solubility in solvents. It is also because polyimides having high solubility in solvents have inferior properties such as heat resistance, the coefficient of linear thermal expansion, and the coefficient of hygroscopic expansion.

As the method for application, for example, a spin coating method, a die coating method, a dip coating method, a bar coating method, a gravure printing method, or a screen printing method can be used.

In the occasion of forming a laminate of the metal base material and the insulating layer, a polyimide film may also be utilized. When a polyimide film is utilized, a laminate of the metal base material and the insulating layer can be obtained by depositing the metal material on the polyimide film.

Furthermore, when the insulating layer is formed in an area excluding the outer peripheral area of the metal base material, as the method for forming the insulating layer, a printing method, a photolithographic method, a method of directly processing with a laser, and the like can be used. Examples of the photolithographic method include: a method of forming a film of polyamic acid as a polyimide precursor on a metal base material, subsequently forming a photosensitive resin film on the polyamic acid film, forming a photosensitive resin film pattern by a photolithographic method, thereafter using the pattern as a mask to remove the polyamic acid film at the pattern opening areas, subsequently removing the photosensitive resin film pattern, and imidizing the polyamic acid; a method of developing the polyamic acid film simultaneously with the formation of the photosensitive resin film pattern as described above, subsequently removing the photosensitive resin film pattern, and imidizing the polyamic acid; a method of forming a photosensitive resin film pattern on the insulating layer in the state of a laminate of the metal base material and the insulating layer, etching the insulating layer according to the pattern by a wet etching method or a dry etching method, and then removing the photosensitive resin pattern; a method of patterning one of the metal base materials of a laminate in which a metal base material, an insulating layer and a metal base material are laminated, using the pattern as a mask to etch the insulating layer, and then removing the metal pattern; and a method of directly forming a pattern of the insulating layer on the metal base material using photosensitive polyimide or a photosensitive polyimide precursor. Examples of the printing method include methods using known printing technologies such as gravure printing, flexo printing, screen printing, and inkjet method.

2. Tacky Adhesive Layer

The tacky adhesive layer according to the present invention is a layer that is formed on the insulating layer and has heat resistance.

Regarding the heat resistance of the tacky adhesive layer, in the case of heating the heat-conductive sealing member of the present invention during the production process, or encapsulating an EL element using the heat-conductive sealing member of the present invention, it is acceptable if the heat-conductive sealing member is able to endure the heating in the process of producing EL elements and the heat generation of EL elements, and it is preferable that no gas be generated from the tacky adhesive layer at the process temperature. Specifically, the 5% weight loss temperature of the tacky adhesive constituting the tacky adhesive layer is 80° C. or higher, more preferably 100° C. or higher, and even more preferably 120° C. or higher. If the 5% weight loss temperature is lower than the range described above, there is a risk that the tacky adhesive may be decomposed by the heat generated at the time of light emission of the EL element, and the substances generated at the time of decomposition may deteriorate the element characteristics. Also, there are occasions in which the tacky adhesiveness of the tacky adhesive layer itself is decreased by thermal deterioration, the adhesiveness to the element becomes poor, and the tacky adhesive layer is detached from the element.

Meanwhile, the 5% weight loss temperature is a value measured using a thermogravimetric analyzer or a differential thermal balance (for example, Thermo Plus TG8120™ (manufactured by Rigaku Corp.)), while the temperature is increased at a rate of temperature increase of 10° C./min in a nitrogen atmosphere.

The tacky adhesive layer is adhered to a transparent substrate when an EL element, for example, is encapsulated using the heat-conductive sealing member of the present invention, so as to cover the transparent electrode layer, the EL layer and the back surface electrode layer, and the tacky adhesive layer has conformity to the irregularities. Specifically, the storage modulus at room temperature of the tacky adhesive layer is preferably from $1.0 \times 10^2$ Pa to $1.0 \times 10^7$ Pa, more preferably from $1.0 \times 10^3$ Pa to $1.0 \times 10^6$ Pa, and particularly preferably from $1.0 \times 10^4$ Pa to $1.0 \times 10^6$ Pa. Meanwhile, room temperature means 25° C. When the storage modulus at room temperature of the tacky adhesive layer is in the range described above, practically sufficient tacky adhesiveness and satisfactory conformity to the irregularities are obtained. If the storage modulus at room temperature is smaller than the range described above, the tacky adhesive layer becomes brittle, and cohesive failure is likely to occur. On the other hand, if the storage modulus at room temperature is larger than the range, sufficient conformity to the irregularities is not easily manifested. The storage modulus serves as an index of hardness and softness, and if the storage modulus at room temperature of the tacky adhesive layer is in the range described above, for example, in the case of an EL element, the tacky adhesive layer can sufficiently cover the level differences between the transparent electrode layer, the EL layer and the back surface electrode layer.

Meanwhile, the storage modulus is a value measured using a dynamic viscoelasticity analyzer (for example, RSA3™ (manufactured by TA Instruments Japan, Inc.)) under the conditions of a frequency of 1 Hz and a rate of temperature increase of 5° C./rain.

Furthermore, in regard to the conformity to the irregularities of the tacky adhesive layer, the glass transition temperature (Tg) of the tacky adhesive that constitutes the tacky adhesive layer is preferably 100° C. or lower, more preferably 50° C. or lower, and even more preferably 30° C. or lower. When an EL element, for example, is encapsulated using the heat-conductive sealing member of the present invention, if the temperature needed at the time of affixing the tacky adhesive layer of the heat-conductive sealing member to the transparent substrate that supports an EL element is lower than the Tg of the tacky adhesive, it is difficult for the tacky adhesive layer to conform to the irregularities. Therefore, it is preferable that the Tg of the tacky adhesive be relatively low, and it is particularly preferable that the Tg be equal to or lower than room temperature. When the Tg of the tacky adhesive is in the range described above, the temperature needed when the tacky adhesive layer of the heat-conductive sealing member is affixed to the transparent substrate that supports an EL element can be lowered.

The tacky adhesive layer usually has insulation properties. Specifically, the volume resistance of the insulating layer is preferably $1.0 \times 10^7$ Ω·m or greater, more preferably $1.0 \times 10^8$ Ω·m greater, and even more preferably $1.0 \times 10^9$ Ω·m or greater.

Meanwhile, the volume resistance can be measured by techniques equivalent to the standard methods such as JIS K6911, JIS C2318 and ASTM D257.

The tacky adhesive used in the tacky adhesive layer is not particularly limited as long as it satisfies the characteristics described above, and in the case where the heat-conductive sealing member of the present invention is used in an EL element, as long as the tacky adhesive does not exert adverse effects on the EL layer. Examples include thermosetting resins such as a polyimide resin, a silicone resin, an epoxy resin, an acrylic resin, a rubber-based resin, and a polyester resin; photocurable resins; and thermoplastic resins such as acid modification products of polyethylene and polypropylene. Among them, thermosetting resins and photocurable resins are preferred. Polyimide resins have excellent heat resistance and heat conductivity. Acrylic resins have higher heat resistance than rubber-based resins, and acrylic resins are general-purpose tacky adhesives and are advantageous in terms of cost. Furthermore, even among tacky adhesives, since acrylic resins have particularly high general-purpose usability, and a large number of commercially available products and developed products are available, selection of the acrylic resin can be made in accordance with the intended characteristics. Polyester resins are advantageous in that they have higher heat resistance and adhesive power than acrylic resins. Silicone resins are advantageous in that they have higher heat resistance than acrylic resins.

Furthermore, from the viewpoint of heat resistance, polyimide resins and silicone resins are preferred. Particularly, non-silicone resins are preferred, and in view of having excellent heat resistance and heat conductivity, polyimide resins are suitable.

Furthermore, the tacky adhesive may also be a curable tacky adhesive. A curable tacky adhesive means an adhesive which has tacky adhesiveness at the time of the production of an element, and is cured after the production of an element. A curable tacky adhesive is advantageous in that the tacky adhesive has stronger adhesiveness to objects to be encapsulated. On the other hand, when the heat-conductive sealing member of the present invention is applied to a flexible EL element, if a curable tacky adhesive is used, when the element is bent, cracks may occur at the cured part of the tacky adhesive layer and deteriorate the element. As the curable tacky adhesive, those thermosetting resins or photocurable resins described above can be used.

Hereinafter, various tacky adhesives will be explained.
(Polyimide Resin)

As the polyimide resin, a resin containing a repeating unit represented by the following formula (III) is preferred:

[Chemical Formula 5]

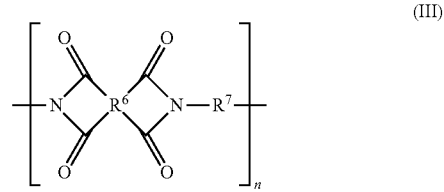

(III)

wherein in the formula (III), $R^6$ represents a tetravalent organic group; $R^7$ represents a divalent organic group; repeating $R^6$s and $R^7$s may be respectively identical with or different from each other; and "n" represents a natural number of 1 or greater.

In the formula (III), generally, $R^6$ is a structure derived from a tetracarboxylic acid dianhydride, and $R^7$ is a structure derived from a diamine.

From the viewpoint of creating tacky adhesiveness, it is preferable that the diamine applied to the polyimide resin include at least aliphatic diamine. Here, aliphatic diamine implies that the carbon atoms bonded to the nitrogen atom of an amino group of the site that links two amino groups are aliphatic carbon, and aromatic diamine implies that the carbon atoms described above are aromatic carbon.

Similarly, also for the tetracarboxylic acid dianhydride, acid dianhydride in which the structure of the site to which two acid anhydride groups are connected is aromatic, is called aromatic acid dianhydride, and acid dianhydride in which the structure is aliphatic is called aliphatic acid dianhydride.

Preferred as the polyimide resin having a repeating unit represented by the above formula (III) is a polyimide resin obtainable by curing a thermosetting polyimide resin composition which includes, as essential components, polyimide (A) prepared by mixing a tetracarboxylic acid component composed of one or more selected from tetracarboxylic acid dianhydride represented by the following formula (1), and tetracarboxylic acid represented by the following formula (2) and derivatives of the tetracarboxylic acid, with an aliphatic diamine represented by the following formula (3) such that the mole number of the tetracarboxylic acid component is excess of the mole number of the aliphatic diamine, and allowing the mixture to react while heated; and polyimide (B) obtainable by mixing the polyimide (A) with an aromatic diamine represented by the following formula (4), and allowing the mixture to react while heated, and which also includes a bifunctional crosslinking agent such as a bismaleimide compound represented by the following formula (5), a bifunctional epoxy compound or a bifunctional acrylate.

[Chemical Formula 6]

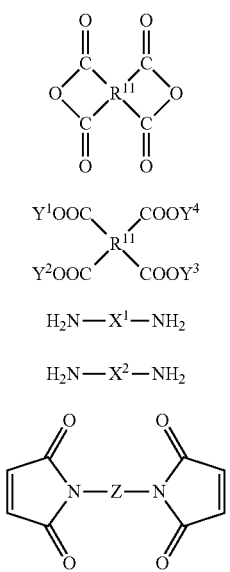

In the formula (1), $R^{11}$ represents a tetravalent organic group; in the formula (2), $R^{11}$ represents a tetravalent organic group; and $Y^1$ to $Y^4$ each independently represent a hydrogen atom or a hydrocarbon group having 1 to 8 carbon numbers; in the formula (3), $X^1$ represents a divalent organic group having 1 to 221 carbon numbers, in which an aliphatic group or an alicyclic group is directly bonded to the amino group, and which may contain an aromatic group, an ether group or another substituent in a part of the structure; in the formula (4), $X^2$ represents a divalent organic group having 6 to 27 carbon numbers, in which an aromatic ring is directly bonded to the amino group, and which may contain an aliphatic group, an alicyclic group or another substituent in a part of the structure; and in the formula (5), "Z" represents a divalent organic group.

Here, $R^6$ in the formula (III) is $R^{11}$ in the formula (1), and $R^7$ in the formula (III) is $X^1$ in the formula (3) or $X^2$ in the formula (4).

That is, the thermosetting polyimide resin composition and the polyimide resin are obtained by a method which includes the following steps (1) to (4).

Step (1): A step of allowing a tetracarboxylic acid component and aliphatic diamine to react while heated, and thereby synthesizing polyimide (A);

Step (2): A step of allowing the polyimide (A) synthesized in Step (1) and aromatic diamine to react while heated, and thereby synthesizing polyimide (B);

Step (3): A step of blending the polyimide (B) synthesized in Step (2) with a bifunctional crosslinking agent, mixing the blend at room temperature, and thereby preparing a thermosetting polyimide resin composition; and Step (4): A step of curing by heating the thermosetting polyimide resin composition obtained in Step (3), and thereby obtaining a polyimide resin.

Among the tetracarboxylic acid dianhydrides of the formula (1), examples of aliphatic tetracarboxylic acid dianhydrides include 1,2,4,5-cyclohexanetetracarboxylic acid dianhydride, 1,2,3,4-butanetetracarboxylic acid dianhydride, 1,2,3,4-cyclobutanetetracarboxylic acid dianhydride, 1,2,3,4-cyclopentanetetracarboxylic acid dianhydride, bicyclo[2.2.2]oct-7-ene-2,3,5,6-tetracarboxylic acid dianhydride, and dicyclohexyltetracarboxylic acid dianhydride.

Among the tetracarboxylic acid dianhydrides of the formula (1), examples of aromatic tetracarboxylic acid dianhydrides include pyromellitic dianhydride, 3,3',4,4'-biphenyltetracarboxylic acid dianhydride, 2,3,3',4'-biphenyltetracarboxylic acid dianhydride, 2,2-bis(3,4-dicarboxyphenyl)propane dianhydride, 2,2-bis(2,3-dicarboxyphenyl)propane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, bis(3,4-dicarboxyphenyl)sulfone dianhydride, bis(3,4-dicarboxyphenyl)ether dianhydride, bis(2,3-diarboxyphenyl)ether dianhydride, 3,3',4,4'-benzophenonetetracarboxylic acid dianhydride, 2,2',3,3'-benzophenonetetracarboxylic acid dianhydride, 4,4'-(p-phenylenedioxy)diphthalic acid dianhydride, 4,4'-(m-phenylenedioxy)diphthalic acid dianhydride, ethylenetetracarboxylic acid dianhydride, 3-carboxymethyl-1,2,4-cyclopentanetricarboxylic acid dianhydride, 1,1-bis(2,3-dicarboxyphenyl)ethane dianhydride, bis(2,3-dicarboxyphenyl)methane dianhydride, and bis(3,4-dicarboxyphenyl)methane dianhydride.

Among the tetracarboxylic acids of the formula (2) and derivatives thereof, examples of aliphatic tetracarboxylic acids and derivatives thereof include 1,2,4,5-cyclohexanetetracarboxylic acid, 1,2,3,4-butanetetracarboxylic acid, 1,2,3,4-cyclobutanetetracarboxylic acid, 1,2,3,4-cyclopentanetetracarboxylic acid, bicyclo[2.2.2]oct-7-ene-2,3,5,6-tetracarboxylic acid, dicyclohexyltetracarboxylic acid, and esters thereof with alcohols having 1 to 8 carbon numbers.

Among the tetracarboxylic acids of the formula (2) and derivatives thereof, examples of aromatic tetracarboxylic acids and derivatives thereof include pyromellitic acid, 3,3',4,4'-biphenyltetracarboxylic acid, 2,3,3',4'-biphenyltetracarboxylic acid, 2,2-bis(3,4-dicarboxyphenyl)propane, 2,2-bis(2,3-dicarboxyphenyl)propane, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, bis(3,4-dicarboxyphenyl)sulfone, bis(3,4-dicarboxyphenyl)ether, bis(2,3-dicarboxyphenyl)ether, 3,3',4,4'-benzophenonetetracarboxylic acid, 2,2',3,3'-benzophenonetetracarboxylic acid, 4,4'-(p-phenyledioxy)diphthalic acid, 4,4'-(m-phenylenedioxy)diphthalic acid, ethylenetetracarboxylic acid, 3-carboxymethyl-1,2,4-cyclopentanetricarboxylic acid, 1,1-bis(2,3-dicarboxyphenyl)ethane, bis(2,3-dicarboxyphenyl)methane, bis(3,4-dicarboxyphenyl)methane, and esters thereof with alcohols having 1 to 8 carbon numbers.

Among these tetracarboxylic acid anhydrides, tetracarboxylic acids and derivatives of the tetracarboxylic acids, those having a structure derived from cyclohexane, or those having a structure derived from benzene are preferred. More preferably, those having a structure derived from cyclohexane are preferred, and particularly preferred compounds are 1,2,4,5-cyclohexanetetracarboxylic acid dianhydride or 1,2,4,5-cyclohexanetetracarboxylic acid. These can be used singly or as mixtures of two or more kinds.

The aliphatic diamine of the formula (3) is diamine in which an aliphatic group or an alicyclic group is directly bonded to the amino group. $X^1$ of the aliphatic diamine of the formula (3) is preferably a divalent organic group having 1 to 221 carbon numbers, and may contain an aromatic group, an ether group or another substituent in a part of the structure. Particularly, if the aliphatic diamine is polyoxyalkylenediamine, it is preferable because flexibility as well as tacky adhesiveness may be obtained. Meanwhile, the term "tacky adhesiveness" as used herein refers to a property of adhering only by applying a slight pressure for a short time at normal temperature, without using water, a solvent, heat or the like. The term "adhesive power" refers to the force required when a specimen is brought into contact with an object to be adhered by applying a slight pressure for a short time at normal temperature, and then tearing off the specimen.

Examples of polyoxyalkylenediamines include polyoxypropylenediamine represented by the following formula (7), polyoxyethylenediamine represented by the following formula (8), polyoxybutylenediamine represented by the following formula (9), and copolymers thereof. As the polyoxypropylenediamine represented by the formula (7) or a copolymer, polyoxyalkylenediamine containing a skeleton represented by the following formula (6) derived from propylene oxide and ethylene oxide is preferred for obtaining a polyimide resin having satisfactory tacky adhesiveness.

[Chemical Formula 7]

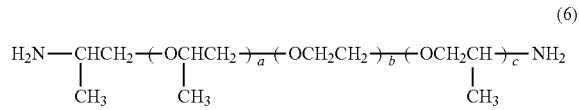
(6)

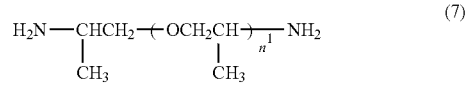
(7)

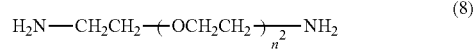
(8)

(9)

In the formula (6), "a" and "c" each represent the degree of polymerization of the propylene oxide unit; and "b" represents the degree of polymerization of the ethylene oxide unit; in the formula (7), $n^1$ represents the degree of polymerization of the propylene oxide unit; in the formula (8), $n^2$ represents the degree of polymerization of the ethylene oxide unit; and in the formula (9), $n^3$ represents the degree of polymerization of the butylene oxide unit.

The polyoxyalkylenediamines are preferably such that they respectively have molecular weight such as described below, in order to obtain polyimide resins having satisfactory tacky adhesiveness. The molecular weight of the polyoxyalkylenediamine of the formula (6) is preferably 300 to 4000 (the degree of polymerization of propylene oxide (a+c) is 1.0 to 9.4 ("c" is not zero), and the degree of polymerization of ethylene oxide (b) is 3.7 to 79.8), and more preferably 600 to 2000 (the degree of polymerization of propylene oxide (a+c) is 3.6 to 6.0 ("c" is not zero), and the degree of polymerization of ethylene oxide (b) is 9.0 to 38.7). The molecular weight of the polyoxypropylenediamine of the formula (7) is preferably 230 to 4000 (the degree of polymerization of propylene oxide, $n^1$, is 2.6 to 68.0), and more preferably 600 to 2000 (the degree of polymerization of propylene oxide, $n^1$, is 8.7 to 33.0). The molecular weight of the polyoxyethylenediamine of the formula (8) is preferably 300 to 4000 (the degree of polymerization of ethylene oxide, $n^2$, is 5.5 to 89.5), and more preferably 600 to 2000 (the degree of polymerization of ethylene oxide, $n^2$, is 12.3 to 44.1). The molecular weight of the polyoxybutylenediamine of the formula (9) is preferably 200 to 4000 (the degree of polymerization of butylene oxide, $n^3$, is 1.6 to 54.3), and more preferably 600 to 2000 (the degree of polymerization of butylene oxide, $n^3$, is 7.1 to 26.6).

Among the aliphatic diamines of the formula (3), examples of diamines other than polyoxyalkylenediamine include 4,4'-diaminodicyclohexylmethane, isophoronediamine, ethylenediamine, tetramethylenediamine, norbornanediamine, para-xylylenediamine, 1,3-bis(aminomethyl)cyclohexane, 1,3-diaminocyclohexane, hexamethylenediamine, meta-xylylenediamine, 4,4'-methylenebis (cyclohexylamine), bicyclohexyldiamine, and siloxanediamines. Among them, it is preferable to use diamines having an alicyclic structure, such as 4,4'-diaminodicyclohexylmethane, isophoronediamine and 1,3-diaminocyclohexane, from the viewpoint that an increase in the molecular weight is easy, and heat resistance is excellent. These diamines can be used singly or as mixtures of two or more kinds.

The polyimide (A), which is a reaction product of the step (1), is obtained by a method of adding a tetracarboxylic acid component composed of one or more compounds selected from tetracarboxylic acid dianhydride, tetracarboxylic acid and derivatives of the tetracarboxylic acid, to an aliphatic diamine, and subjecting the mixture to an imidization reaction.

The polyimide (A), which is a reaction product of the step (1) is preferably synthesized by incorporating a tetracarboxylic acid component composed of one or more compounds selected from tetracarboxylic acid dianhydride represented by the formula (1), tetracarboxylic acid represented by the formula (2) and derivatives of the tetracarboxylic acid, preferably at a ratio of from 1.01 moles to 2 moles, and more preferably at a ratio of from 1.5 moles to 2 moles, relative to 1 mole of aliphatic diamine represented by the formula (3). At this time, it is preferable to dispose an acid anhydride group or a group of a dicarboxylic acid derivative capable of forming imide, at the two ends of the reaction product. When the tetracarboxylic acid component is incorporated at a ratio of 1 mole or less relative to 1 mole of the aliphatic diamine, the two ends of the reaction product of the step (1) do not have those groups derived from the tetracarboxylic acid component in many cases, and it is not preferable in view of allowing the reaction product of the step (1) to react with aromatic diamine as will be described below. When one or more kinds of the tetracarboxylic acid component are incorporated at a ratio larger than 2 moles relative to 1 mole of the aliphatic diamine, there is a risk that a large amount of unreacted tetracarboxylic acid component molecules may remain, and there may be residual monomer components, resulting in a decrease in heat resistance.

The polyimide (A) described above is obtained by performing a thermal imidization reaction in the absence of solvent, but various organic solvents may also be used. Specifically, one kind or two or more kinds of solvents selected from N,N-dimethylacetamide, N-methyl-2-pyrrolidone, N,N-dimethylformamide, dimethyl sulfoxide, hexamethyl phosphoramide, and tetramethylenesulfone can be used. Particularly, it is preferable to use N-methyl-2-pyrrolidone or N,N-dimethylacetamide as the solvent. Furthermore, xylene or toluene may be added so as to perform azeotropic dehydration. After the synthesis of the polyimide (A), the polyimide (A) may be diluted with a low boiling point solvent such as tetrahydrofuran, acetone or methanol.

If necessary, the aliphatic diamine may also be used after being dissolved in an organic solvent such as described above. The reaction temperature for the imidization reaction is preferably 150° C. to 200° C., and particularly preferably 180° C. to 200° C. If the reaction temperature is lower than 150° C., the increase of molecular weight is not sufficiently achieved, and practical polyimide cannot be synthesized. If the reaction temperature is higher than 200° C., it is not preferable in terms of economic efficiency due to the problem of cost. The reaction time is preferably 1 to 12 hours, and particularly preferably 3 to 6 hours. If the reaction time is shorter than one hour, the increase of molecular weight is not sufficiently achieved, and practical polyimide cannot be synthesized. If the reaction time is longer than 12 hours, it is not preferable in terms of economic efficiency due to the problem of cost. Also, the imidization reaction may be carried out after adding toluene or xylene as an azeotropic solvent. The production of polyimide can be confirmed by the characteristic absorption of the imide ring in the vicinity of 1770 $cm^{-1}$ and 1700 $cm^{-1}$ in the IR spectrum.

The polyimide (B) of the step (2) described above is obtained by a method of mixing the polyimide (A) obtained in the step (1) with aromatic diamine, and subjecting the mixture to an imidization reaction. The synthesis is carried out by incorporating the aromatic diamine represented by the formula (4) preferably at a ratio of from 0.02 moles to 2 moles, and more preferably at a ratio of from 1 mole to 2 moles, relative to 1 mole of the aliphatic diamine used to produce the polyimide (A). At this time, it is preferable to dispose aromatic amino groups at the two ends of the polyimide (B). If the aromatic diamine is incorporated at a ratio larger than 2 moles relative to 1 mole of the aliphatic diamine, the proportion of unreacted aromatic diamine molecules becomes large, and the flexibility of the polyimide resin obtainable in the subsequent steps is lowered.

The aromatic diamine of the formula (4) is diamine in which an aromatic ring is directly bonded to the amino group. $X^2$ is preferably a divalent organic group having 6 to 27 carbon numbers, and may contain an aliphatic group, an alicyclic group or another substituent in a part of the structure. Examples of the aromatic diamine represented by the formula (4) include 3,4'-diaminodiphenyl ether, 4,4'-diaminodiphenyl ether, 4,4'-diaminodiphenylmethane, 4,4'-diaminodiphenylsulfone, m-phenylenediamine, p-phenylenediamine, 2,4-toluenediamine, diaminobenzophenone, 2,6-diaminonaphthalene, 1,5-diaminonaphthalene, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, α,α'-bis(3-aminophenyl)-1,4-diisopropylbenzene, bis[4-(4-aminophenoxy)phenyl]sulfone, bis[4-(3-aminophenoxy)phenyl]sulfone, α,α'-bis(4-aminophenyl)-1,4-diisopropylbenzene, and 2,2-bis(4-aminophenoxyphenyl)propane. Among these, a preferred compound is 4,4'-diaminodiphenyl ether, and these can be used singly or as mixtures of two or more kinds.

The polyimide (B) described above is obtained by performing a thermal imidization reaction in the absence of solvent, but various organic solvents may also be used. Specifically, one kind or two or more kinds of high boiling point solvents such as N,N-dimethylacetamide, N-methyl-2-pyrrolidone, N,N-dimethylformamide, dimethyl sulfoxide, hexamethylphosphoramide, and tetramethylenesulfone; and low boiling point solvents such as tetrahydrofuran and acetone can be used. Particularly, it is preferable to use N-methyl-2-pyrrolidone or N,N-dimethylacetamide as the solvent. Furthermore, xylene or toluene may be added so as to perform azeotropic dehydration. After the synthesis of the polyimide (B), the polyimide may be diluted with a low boiling point solvent such as tetrahydrofurane, acetone, or methanol.

If necessary, the aromatic diamine may be used after being dissolved in organic solvent such as described above. The reaction temperature of the imidization reaction is preferably 150° C. to 200° C., and particularly preferably 180° C. to 200° C. If the reaction temperature is lower than 150° C., the increase of molecular weight is not sufficiently achieved, and practical polyimide cannot be synthesized. If the reaction temperature is higher than 200° C., it is not preferable in terms of economic efficiency due to the problem of cost. The reaction time is preferably 1 to 12 hours, and particularly preferably 3 to 6 hours. If the reaction time is shorter than one hour, the increase of molecular weight is not sufficiently achieved, and practical polyimide cannot be synthesized. If the reaction time is not longer than 12 hours, it is not preferable in terms of economic efficiency due to the problem of cost. Furthermore, the imidization reaction may be carried out after adding toluene or xylene as an azeotropic solvent.

The thermosetting polyimide resin composition is obtained by blending the polyimide (B) and a bifunctional crosslinking agent, and mixing the blend at room temperature. The bifunctional crosslinking agent is preferably a bismaleimide compound represented by the above formula (5) or a bifunctional epoxy compound, from the viewpoint of heat resistance.

Examples of the bismaleimide compound of the formula (5) include the following: N,N'-(4,4'-diphenylmethane)bismaleimide, N,N'-(4,4'-diphenyloxy)bismaleimide, N,N'-(4,4'-diphenylsulfone)bismaleimide, N,N'-p-phenylenebismaleimide, N,N'-m-phenylenebismaleimide, N,N'-2,4-tolylenebismaleimide, N,N'-2,6-tolylenebismaleimide, N,N'-ethylenebismaleimide, N,N'-hexamethylenebismaleimide, N,N'-{4,4'-[2,2'-bis(4",4'''-phenoxyphenyl)isopropylidene]}bismaleimide, N,N'-{4,4'-[2,2'-bis(4",4'''-phenoxyphenyl)hexafluoroisopropylidene]}bismaleimide, N,N'-[4,4'-bis(3,5-dimethylphenyl)methane]bismaleimide, N,N'-[4,4'-bis(3,5-diethylphenyl)methane]bismaleimide, N,N'-[4,4'-(3-methyl-5-ethylphenyl)methane]bismaleimide, N,N'-[4,4'-bis(3,5-diisopropylphenyl)methane]bismaleimide, N,N'-(4,4'-dicyclohexylmethane)bismaleimide, N,N'-p-xylylenebismaleimide, N,N'-m-xylylenebismaleimide, N,N'-(1,3-dimethylenecyclohexane)bismaleimide, and N,N'-(1,4-dimethylenecyclohexane)bismaleimide. Furthermore, a bismaleimide compound in which the two ends of polyoxyalkylenediamine are shielded with maleic anhydride, can also be used. Examples include a bismaleimide compound in which the two ends of polyoxyethylenediamine are blocked with maleic anhydride, a bismaleimide compound in which the two ends of polyoxypropylenediamine are blocked with maleic anhydride, and a compound in which the two ends of polyoxybutylenediamine are blocked with maleic anhydride. Among these, preferred are N,N'-(4,4'-diphenylmethane)bismaleimide represented by the following formula (10) and N,N'-[4,4'-bis(3-methyl-5-ethylphenyl)methane]bismaleimide represented by the following formula (11).

[Chemical Formula 8]

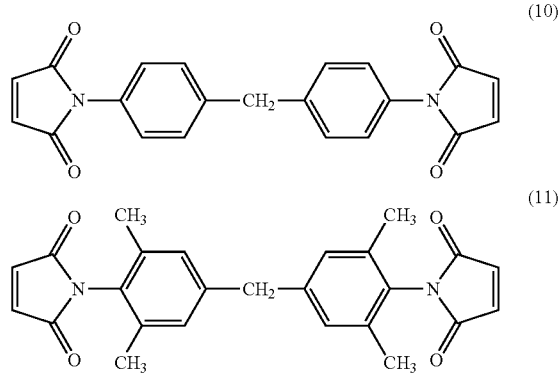

At the time of preparing the thermosetting polyimide resin composition of the step (3), when a bismaleimide compound represented by the above formula (5) is incorporated preferably at a ratio of from 0.25 moles to 4 moles, and more preferably at a ratio of from 0.75 moles to 2 moles, relative to 1 mole of the aliphatic diamine used to produce the polyimide (A), a thermosetting polyimide resin composition which results in a flexible polyimide resin is obtained. When the bismaleimide compound is incorporated at a ratio smaller than 0.25 moles relative to 1 mole of the aliphatic diamine used to produce the polyimide (A), the crosslinking density of the polyimide resin is low, and the strength is insufficient. When the tetracarboxylic acid component is incorporated at a ratio of from 1.01 moles to 2 moles relative to 1 mole of the aliphatic diamine, the aromatic diamine is incorporated at a ratio of from 0.02 moles to 2 moles relative to 1 mole of the aliphatic diamine, and the bismaleimide compound is incorporated at a ratio larger than 4 moles relative to 1 mole of the aliphatic diamine, the flexibility of the polyimide resin is decreased.

Examples of the solvent used in the preparation of the thermosetting polyimide resin composition of the step (3) include amide-based solvents such as N,N-dimethylacetamide, N-methyl-2-pyrrolidone, N,N-dimethylformamide, and hexamethylphosphoramide; ketone-based solvents such as methyl ethyl ketone, and acetone; cyclic ether-based solvents such as 1,4-dioxane, and tetrahydrofuran; and acetonitrile. Particularly, it is preferable to use amide-based solvents such as N,N-dimethylacetamide, N-methyl-2-pyrrolidone, N,N-dimethylformamide, and hexamethylphosphoramide.

The thermosetting polyimide resin composition of the step (3) is obtained by the following method. The polyimide (B) obtained in the step (2) and a bifunctional crosslinking agent are dissolved in a solvent, and the mixture is mixed until a uniform liquid is obtained. The amount of the solvent in the thermosetting polyimide resin composition is preferably an amount which results in a viscosity capable of film formation by casting. The mixing temperature is preferably 0° C. to 80° C., and more preferably 20° C. to 60° C. If the mixing temperature is lower than 0° C., the bifunctional crosslinking does not easily dissolve, and it is difficult to obtain a uniform liquid. If the mixing temperature is higher than 80° C., the resin composition is cured from the liquid state to the solid state during mixing.

A polyimide resin having tacky adhesiveness may be obtained by thermally curing the thermosetting polyimide resin composition thus obtained, and when the thermosetting polyimide resin composition is cast on a metal base material having an insulating layer formed thereon, or on a peeling layer into a film form, and is thermally cured, a tacky adhesive layer containing a polyimide resin is obtained. The curing temperature is preferably 150° C. to 250° C. If the curing temperature is lower than 150° C., uncured areas remain, and the tacky adhesive power becomes excessively high, so that when a peeling layer is affixed to the tacky adhesive layer and then peeled, cohesive failure occurs, and adhesive residues are generated. If the curing temperature is higher than 250° C., it is not preferable in terms of economic efficiency due to the problem of cost. The curing time is preferably 0.5 hours to 10 hours. If the curing time is shorter than 0.5 hours, uncured areas remain, and the tacky adhesive power becomes excessively high, so that when a peeling layer is affixed to the tacky adhesive layer and then peeled, cohesive failure occurs, and adhesive residues are generated. If the curing time is longer than 10 hours, it is not preferable in terms of economic efficiency due to the problem of cost.

(Acrylic Resin)

For the tacky adhesive formed from an acrylic resin, a polymer of (meth)acrylic acid alkyl ester or a copolymer with other copolymerizable monomers is usually used. Examples of the alkyl ester in the (meth)acrylic acid alkyl ester include methyl ester, ethyl ester, butyl ester, 2-methylhexyl ester, octyl ester, and isononyl ester. Furthermore, examples of the other copolymerizable monomers include hydroxyhexyl ester of (meth)acrylic acid (for example, hydroxyethyl ester, hydroxybutyl ester, and hydroxyhexyl ester), (meth)acrylic acid glycidyl ester, (meth)acrylic acid, itaconic acid, maleic anhydride, (meth)acrylic acid amide, (meth)acrylic acid N-hydroxymethylamide, (meth)acrylic acid alkylaminoalkyl esters (for example, dimethylaminoethyl methacrylate), vinyl acetate, styrene, and acrylonitrile.

Examples of the tacky adhesive formed from an acrylic resin include a thermosetting tacky adhesive containing a thermosetting component, and a radiation-curable tacky adhesive containing a radiation-curable component.

As the thermosetting type curable component, for example, a crosslinking agent such as a compound having two or more of a functional group such as an isocyanate group (polyisocyanate) or an epoxy group (epoxy resin) in the molecule; a polyfunctional acrylate such as 1,6-hexanediol diacrylate or triethylene glycol diacrylate; or a metal chelate compound, is used. Meanwhile, the thermosetting type curable component is not particularly limited to these.

Furthermore, the amount of incorporation of the crosslinking agent in the tacky adhesive layer is preferably in the range of 0.2 parts by weight to 10 parts by weight of the tacky adhesive composition. If the amount of incorporation is less than the range described above, the crosslinking density may be low, and curing may not occur sufficiently. Also, if the amount of incorporation is greater than the range described above, the crosslinking density may be too high, and the tacky adhesive power may not be maintained.

As the radiation-curable component, a reactive polymer having a carbon-carbon double bond in the molecule can be applied. Examples of the radiation-curable component include trimethylolpropane tri(meth)acrylate, pentaerythritol tri(meth)acrylate, tetraethylene glycol di(meth)acrylate, 1,6-hexanediol di(meth)acrylate, an esterification product of neopentyl glycol di(meth) acrylic acid and a polyhydric alcohol, an ester acrylate oligomer, 2-propenyl di-3-butenyl cyanurate, and 2-hydroxyethyl bis(2-acryloxyethyl)isocyanurate or isocyanurate compound.

These components are used after a photopolymerization initiator (for example, Irgacure 184™, Irgacure 651™, Irgacure369™, Irgacure 1800™ (Ciba Specialty Chemicals), Chivacure TPO™, Chivacure 107™, Chivacure 173™ or Chivacure 1256™ (Chitech Chemical Co., Ltd.), in an amount of about 0.001 part by weight to 5.0 parts by weight is added thereto.

Furthermore, when a thermal polymerization initiator is used instead of the photopolymerization initiator in the tacky adhesive containing a radiation-curable component is used, the tacky adhesive can be used as a thermosetting tacky adhesive.

(Polyester Resin)

In the tacky adhesive formed from a polyester resin, a polyester resin containing, as a main component, copolymerized polyester produced by polycondensing an acid component and a polyol component, is used. The polycondensation reaction is carried out by a generally known reaction such as a direct esterification method or a transesterification method.

As the acid component of the polyester resin, terephthalic acid, isophthalic acid, phthalic anhydride, α-naphthalenedicarboxylic acid, 5-sodium sulfoisophthalic acid, 5-potassium sulfoisophthalic acid, and esters thereof; aliphatic dicarboxylic acids such as pimellic acid, suberic acid, azelaic acid, sebacic acid, undecylenic acid, dodecanedicarboxylic acid, and esters thereof; and alicyclic dicarboxylic acids such as 1,4-cyclohexahydrophthalic anhydride are used. Among them, terephthalic acid, isophthalic acid and sebacic acid are preferred. These can be used singly, or as mixtures of two or more kinds.

Furthermore, as the alcohol component of the polyester resin, aliphatic glycols such as 1,2-propylene glycol, polytetramethylene oxide glycol, ethylene glycol, 1,3-propylene glycol, 1,3-butanediol, 1,4-butanediol, 1,5-pentanediol, 1,6-hexanediol, 1,8-octanediol, 1,9-nonanediol, neopentyl glycol, 3-methylpentanediol, 2,2,3-trimethylpentanediol, diethylene glycol, triethylene glycol, and dipropylene glycol; alicyclic glycols such as 1,4-cyclohexanediol, and 1,4-cyclohexanedimethanol; and aromatic glycols such as bisphenol A are used. Among them, 1,2-propylene glycol, polytetramethylene oxide glycol, ethylene glycol and 1,4-butanediol are preferred. These can be used singly or as a mixture or a polymer of two or more kinds.

The polyester resin can be produced according to a conventionally known method for producing a polyester resin, and for example, saturated polyester resins manufactured by Nippon Synthetic Chemical Industry Co., Ltd., "Polyester" (registered trademark) XI-0001, XI-0002, XI-1001, XI-1002, XI-1003, XI-1004 and NP101 can be used.

Furthermore, as the crosslinking agent, for example, a compound having two or more of a functional group such as an isocyanate group (polyisocyanate) or an epoxy group (epoxy resin) in the molecule; a polyfunctional acrylate such as 1,6-hexanediol diacrylate or triethylene glycol diacrylate; or a metal chelate compound is used. Meanwhile, the crosslinking agent is not particularly limited to these.

(Silicone Resin)

The tacky adhesive formed from a silicone resin contains a silicone copolymer as the silicone resin. Examples of the silicone copolymer include addition polymerized type silicone copolymers having a vinylsilyl group (Si—CH=$CH_2$ group) or a hydrosilyl group (Si—H group). As the addition polymerized type silicone copolymer, SD4560™, SD4570™, SD4580™, SD4584™, SD4585™, SD4585™, SD4592™, BY24-740™ (manufactured by Dow Corning-Toray Co., Ltd.), X-40-3068™, X-40-3102™, X-40-3103™, or X-40-3104™ (manufactured by Shin-Etsu Chemical Co., Ltd.) is used. Meanwhile, the addition polymerized type silicone copolymer is not particularly limited to these.

Furthermore, as the catalyst, for example, SRX212™ (manufactured by Dow Corning-Toray Co., Ltd.) or CAT-PL-50T™ (manufactured by Shin-Etsu Chemical Co., Ltd.) is used. Meanwhile, the catalyst is not particularly limited to these. The amount of incorporation of the catalyst is preferably 0.1 part by weight or more of the tacky adhesive composition described above. It is because if the amount of incorporation is less than the range described above, the reaction of the silicone polymer may not be accelerated.

When a silicone resin is used as the tacky adhesive, a crosslinking agent may be added. As the crosslinking agent, for example, BY24-741™, RD-1™, or RD-2™ (manufactured by Dow Corning-Toray Co., Ltd.) is used. Meanwhile, the crosslinking agent is not particularly limited to these. The amount of incorporation in the case of adding a crosslinking agent is preferably in the range of 0.1 part by weight to 3 parts by weight of the tacky adhesive composition. It is because if the amount of incorporation is less than the range described above, the significant effect of adding a crosslinking agent is not obtained. Furthermore, it is because if the amount of incorporation is greater than the range described above, the crosslinking density becomes too high, and as a result, the tacky adhesive power cannot be maintained.

The tacky adhesive layer will be further explained.

In the case of post-curing the resin composition used in the tacky adhesive layer, it is preferable that the resin composition contain an additive which initiates the curing reaction at the time of dehydration and baking during the process of forming the tacky adhesive layer. Examples of such an additive include a thermal base generator or a photo base generator.

The tacky adhesive layer may also contain an oxidation inhibitor. If the amount of addition of the oxidation inhibitor increases, the heat resistance of the tacky adhesive layer is enhanced; however, there is also an increased possibility of causing a decrease in the reliability of EL elements due to the migration of the oxidation inhibitor in the tacky adhesive layer to the EL layer, or the like. Therefore, it is more desirable if the content of the oxidation inhibitor is as small as possible in view of the balance with heat resistance.

The tacky adhesive layer may contain a moisture absorbent. It is because the penetration of moisture from the outside can be more effectively prevented through the moisture absorption of the moisture absorbent in the tacky adhesive layer. Thereby, when an EL element is produced using the heat-conductive sealing member of the present invention, deterioration of the element performance can be further suppressed.

Meanwhile, the moisture absorbent is the same as described above in the section for the insulating layer, and therefore, further description thereon will not be repeated here.

The content of the moisture absorbent is not particularly limited, but the content is preferably in the range of 5 parts by mass to 80 parts by mass, more preferably 5 parts by mass to 60 parts by mass, and even more preferably in the range of 5 parts by mass to 50 parts by mass, relative to 100 parts by mass of the total amount of the moisture absorbent and the resin.

The content of the moisture absorbent in the tacky adhesive layer may be uniform or may be non-uniform. Inter alfa, it is preferable that the moisture absorbent be included only in the outer peripheral area of the tacky adhesive layer. It is because when an EL element, for example, is encapsulated using the heat-resistant sealing member of the present invention, if the moisture absorbent is included in the area of the tacky adhesive layer which is brought into contact with the back surface electrode layer, there is a risk that the surface of the tacky adhesive layer may be roughened due to the moisture absorbent, and the EL layer may be damaged. That is, it is preferable that when an EL element, for example, is encapsulated using the heat-resistant sealing member of the present invention, the moisture absorbent be included in the area of the tacky adhesive layer which is not brought into contact with the back surface electrode layer.

Furthermore, the tacky adhesive layer may have a function as a white light reflective layer. It is because when the heat-conductive sealing member of the present invention is used in an EL element, since the light emitted from the EL layer is diffused and reflected at the surface of the tacky adhesive layer, which is a white light reflective layer, the angle-dependency of the emitted light color can be mitigated by an interference effect.

The thickness of the tacky adhesive layer is not particularly limited as long as the tacky adhesive layer can have both the conformity to the irregularities and heat conductivity, and specifically, the thickness is preferably in the range of 0.1 μm to 30 μm, more preferably in the range of 0.5 μm to 20 μm, and even more preferably in the range of 1 μm to 10 μm. It is because if the thickness of the tacky adhesive layer is too small, sufficient conformity to the irregularities may not be obtained, and if the thickness of the tacky adhesive layer is too large, there is a risk that the heat conductivity may deteriorate.

The tacky adhesive layer may be formed over the entire surface of the metal base material, or may be formed partially on the metal base material. Inter alia, it is preferable that the tacky adhesive layer be partially formed on the metal base material. That is, as described above in the section for the insulating layer, it is preferable that the surface of the metal base material where an insulating layer and a tacky adhesive layer are formed, be provided with a metal base material-exposed region where the insulating layer and the tacky adhesive layer are absent and the metal base material is exposed.

Figure 5:
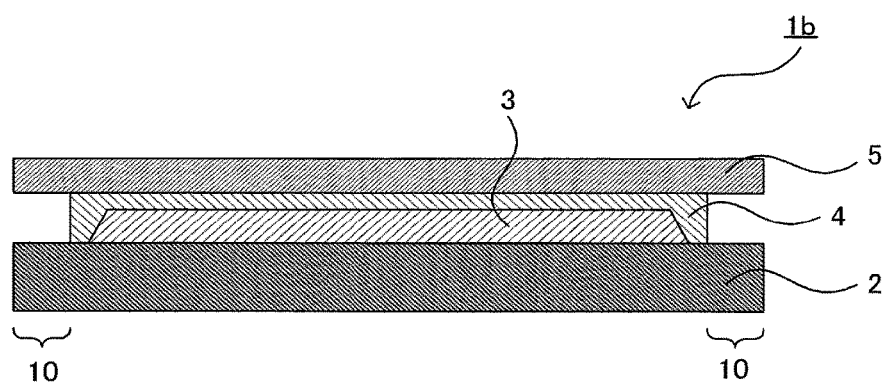
FIG. 5 is a schematic cross-sectional diagram showing still another example of the heat-conductive sealing member of the present invention.

In the case where the tacky adhesive layer is partially formed on the metal base material, and where the tacky adhesive layer is formed from a polyimide resin and does not contain a moisture absorbent, as illustrated in FIG. 5, it is preferable that the tacky adhesive layer 4 be formed in an area excluding the outer peripheral area 10 of the metal base material 2. When an EL element, for example, is produced using the heat-conductive sealing member of the present invention, if the tacky adhesive layer is formed over the entire surface of the metal base material and the cross-sections of the tacky adhesive layer are exposed, since polyimide resins generally exhibit water absorbency, there is a risk that moisture may penetrate through the cross-section of the tacky adhesive layer at the time of production or at the time of driving. This moisture may cause deterioration of the element performance or change the dimension of the tacky adhesive layer. Therefore, when the tacky adhesive layer is formed from a polyimide resin and does not contain a moisture absorbent, it is preferable that the tacky adhesive layer be not formed in the outer peripheral area of the metal base material.

As the method for forming a tacky adhesive layer, a method of applying a resin composition can be used. When the resin composition is applied, the resin composition may be applied on the insulating layer or may be applied on the peeling layer. Furthermore, when a method of die-cutting a processing sheet as will be described below is employed, the resin composition is applied on a peeling sheet. The coating method is not particularly limited as long as the resin composition can be applied to a uniform thickness, and for example, a spin coating method, a die coating method, a dip coating method, a bar coating method, a gravure printing method, or a screen printing method can be used.

Also, when the tacky adhesive layer is formed in an area excluding the outer peripheral area of the metal base material, as the method for forming the tacky adhesive layer, a printing method, a photolithographic method, a method of directly processing with a laser, a method of die-cutting a processing sheet, or the like can be used. In the case of the method of die-cutting a processing sheet, when a processing sheet in which a tacky adhesive layer is formed on a peeling sheet is die-cut, a peeling layer is affixed on the tacky adhesive layer, and the peeling sheet is peeled off from the tacky adhesive layer, a laminate of a peeling layer and a tacky layer that can be formed in an area excluding the outer peripheral area of the metal base material can be obtained. As the peeling sheet used in this case, a common peeling sheet can be used.

3. Metal Base Material

The metal base material according to the present invention is to support the insulating layer and the tacky adhesive layer described above.

The coefficient of linear thermal expansion of the metal base material is preferably in the range of 0 ppm/° C. to 25 ppm/° C., more preferably in the range of 0 ppm/° C. to 18 ppm/° C., even more preferably in the range of 0 ppm/° C. to 12 ppm/° C., and particularly preferably in the range of 0 ppm/° C. to 7 ppm/° C., from the viewpoint of dimensional stability. Meanwhile, the method for measuring the coefficient of linear thermal expansion is the same as the method for measuring the coefficient of linear thermal expansion of the insulating layer, except that a metal foil is cut to a size of 5 mm in width×20 mm in length, and this is used as an evaluation sample.

Examples of the metal material that constitutes the metal base material include aluminum, copper, a copper alloy, phosphor bronze, stainless steel (SUS), gold, a gold alloy, nickel, a nickel alloy, silver, a silver alloy, tin, a tin alloy, titanium, iron, an iron alloy, zinc, and molybdenum. Among them, in the case of applying the metal base material to large-sized elements, SUS is preferred. SUS has excellent durability, oxidation resistance, heat resistance, and a smaller coefficient of linear thermal expansion as compared with copper, and excellent dimensional stability. Furthermore, SUS304 and SUS430 are advantageous in that they are easily available. From the viewpoint of heat dissipation properties, copper or aluminum is preferred; however, copper is prone to oxidation and degradation, while aluminum has low heat resistance and inferior chemical resistance. Thus, there is a problem that the processes are restricted.

Figure 6:
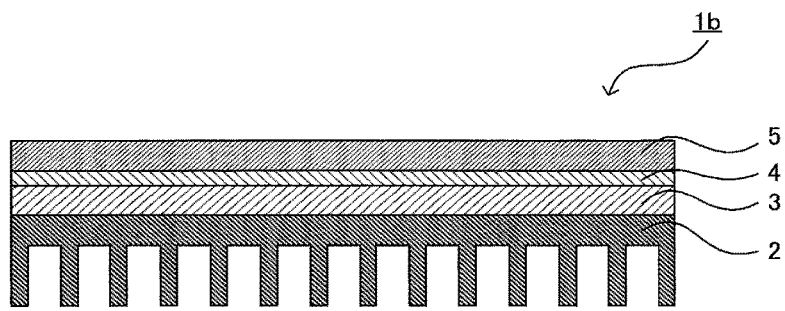
FIG. 6 is a schematic cross-sectional diagram showing still another example of the heat-conductive sealing member of the present invention.

The shape of the metal base material is not particularly limited, and for example, the metal base material may be in a foil form or a plate form. As illustrated in FIG. 6, the shape of the metal base material 2 may have a shape having irregularities on the surface that is brought into contact with air.

Among others, it is preferable that the metal base material have irregularities on the surface that is brought into contact with air. When the metal base material has irregularities on the surface that is brought into contact with air, heat diffusion is ameliorated, and heat dissipation properties can be increased.

As the method for forming irregularities, for example: a method of subjecting the surface of the metal base material directly to processing such as emboss processing, etching processing, sand blast processing, frost processing or stamp processing; a method of forming a irregularity pattern using a photoresist or the like; a plating method; or a method of bonding a metal layer having a foil form or a plate form with a metal layer having irregularities on the surface, may be used. In the case of emboss processing, for example, a rolling roll having irregularities on the surface may be used. In the case of etching processing, the chemical agent is selected depending on the type of the metal base material. In the case of the method of bonding a metal layer having a foil form or a plate form and a metal layer having irregularities on the surface, for example, metal layers are bonded to each other by brazing, welding or soldering, or the metal layers can be bonded to each other through an adhesive such as an epoxy resin. In this case, the metal layer having a foil form or a plate form and a metal layer having irregularities on the surface may be formed from the same metal material, or may be formed from different metal materials.

Among them, emboss processing and etching processing are used with preference in view of cost.

The dimension or shape of the irregularities is not particularly limited as long as the surface area of the surface of the metal base material that is brought into contact with air can be increased. The width, height, pitch and the like of the irregularities may be appropriately selected in accordance with factors such as the type of the metal base material, or the use of the heat-conductive sealing member, and ranges of the width, height, pitch and the like that are suitable for heat conduction can be determined by, for example, simulation.

The thickness of the metal base material is not particularly limited as long as the metal base material can have heat conductivity, and the thickness may be appropriately selected in accordance with the use of the heat-conductive sealing member of the present invention. As the thickness of the metal base material is larger, excellent heat diffusion in the plane direction is obtained. On the other hand, as the thickness of the metal base material is smaller, a highly flexible metal base material is obtained. For example, when the heat-conductive sealing member of the present invention has flexibility, it is desirable that the metal base material can have both heat conductivity and flexibility, and specifically, the thickness is preferably in the range of 1 µm to 1000 µm, more preferably in the range of 2 µm to 300 µm, and even more preferably in the range of 5 µm to 50 µm. If the thickness of the metal base material is too small, the heat dissipation function cannot be sufficiently exhibited, or the gas barrier properties against water vapor may deteriorate. Furthermore, if the thickness of the metal base material is too large, flexibility may decrease or become excessive, or high product cost may be required.

As the method for producing the metal base material, a general method can be used, and the method may be appropriately selected in accordance with the type of the metal base material, the thickness of the metal base material or the like. For example, the method may be a method of obtaining a simple form of the metal base material, or may be a method of depositing a metal material on an insulating layer formed from a polyimide film, and obtaining a laminate of the metal base material and the insulating layer. Among them, from the viewpoint of gas barrier properties, a method of obtaining a simple form of the metal base material is preferred. In the case of the method of obtaining a simple form of the metal base material, and in the case where the metal base material is a metal foil, the metal foil may be a rolled foil or may be an electrolytic foil. However, from the viewpoint of having satisfactory gas barrier properties, a rolled foil is preferred.

4. Peeling Layer

According to the present invention, it is preferable that a peeling layer be formed on the tacky adhesive layer. It is because handling of the heat-conductive sealing member of the present invention is made easy.

It is preferable that the peeling layer have gas barrier properties. It is because moisture absorption of the insulating layer or the tacky adhesive layer can be suppressed, and the heat-conductive sealing member of the present invention can be stably maintained. The gas barrier properties of the peeling layer may be gas barrier properties to the extent that can suppress the moisture absorption of the insulating layer or the tacky adhesive layer until the heat-conductive sealing member of the present invention is used in the encapsulation of, for example, an organic EL element. Specifically, it is preferable that the peeling layer have barrier properties against water, and the water vapor permeability of the peeling layer may be $1.0 \times 10^{-1}$ g/m$^2$/day or less, preferably $1.0 \times 10^{-3}$ g/m$^2$/day or less, and more preferably $1.0 \times 10^{-5}$ g/m$^2$/day or less. Meanwhile, the water vapor permeability is a value measured using a water vapor permeability analyzer, Permatran 3/31™ (manufactured by Mocon, Inc.) under the conditions of 40° C. and 100% RH.

The peeling layer is not particularly limited as long as it is peelable and satisfies predetermined gas barrier properties. Examples include a laminate having a gas barrier layer formed on a base material film, a metal foil, a simple form of film, and a co-extruded film.

The material of the base material film is not particularly limited as long as the material can be made into a film, and examples include: polyethylene resins, polypropylene resins, cyclic polyolefin resins, polystyrene resins such as a syndiotactic polystyrene resin, acrylonitrile-styrene copolymers (AS resins), acrylonitrile-butadiene-styrene copolymers (ABS resins), polyvinyl chloride resins, fluororesins, poly(meth)acrylic resins, polycarbonate resins, polyester resins such as polyethylene terephthalate and polyethylene naphthalate, polyamide resins such as various nylons, polyimide resins, polyamideimide resins, polyaryl phthalate resins, silicone resins, polysulfone resins, polyphenylene sulfide resins, polyether sulfone resins, polyurethane resins, acetal resins, cellulose resins, and other various resins. Composite materials obtained by incorporating fine particles or powders of organic substances or inorganic substances into these resins may also be used.

The thickness of the base material film is not particularly limited as long as it is a thickness capable of acquiring peelability, and the thickness can be adjusted to the extent that is equal to the thickness of the base material film in general gas barrier films. If the thickness of the base material film is large, flexibility may decrease, and if the thickness of the base material film is small, there is a possibility that strength may deteriorate due to the material constituting the base material film.

The material of the gas barrier layer is not particularly limited as long as the material has gas barrier properties, and any inorganic materials or organic materials can all be used.

Examples of the inorganic materials to be used in the gas barrier layer include inorganic oxides, inorganic oxynitrides, inorganic nitrides and metals. These can be used singly or in combination of two or more kinds. Examples of the inorganic oxides include silicon oxide, aluminum oxide, magnesium oxide, titanium oxide, tin oxide, and an indium oxide alloy. Examples of the inorganic oxynitrides include silicon oxynitride. Examples of the inorganic nitrides include silicon nitride, aluminum nitride and titanium nitride. Examples of the metals include aluminum, silver, tin, chromium, nickel and titanium. When a material containing a nitride as an inorganic material is used, the material frequently exhibits releasability with respect to the tacky adhesive layer, and the material can be used as a material which has both gas barrier properties and releasability.

On the other hand, examples of the organic materials to be used in the gas barrier layer include epoxy/silicates, polyvinyl alcohol (PVA), and ethylene-vinyl alcohol copolymers (EVOH). PVA and EVHO can be used singly or as a mixture.

The gas barrier layer may be a single layer or may be a laminate of plural layers.

The thickness of the gas barrier layer is not particularly limited as long as it is a thickness capable of obtaining peelability and gas barrier properties. The thickness may be appropriately selected in accordance with the material of the gas barrier layer, and the thickness can be adjusted to the extent that is equal to the thickness of the gas barrier layer in general gas barrier films. If the thickness of the gas barrier layer is large, flexibility may decrease, or cracks may occur. If the thickness of the gas barrier layer is small, there is a possibility that sufficient gas barrier properties may not be obtained.

The method for forming the gas barrier layer may be a dry method or may be a wet method, and the method may be appropriately selected in accordance with the material. When an inorganic material is used in the gas barrier layer, usually a dry method is used. Among others, a vacuum film formation method is preferred, and particularly when the heat resistance of the resin film itself at the time of forming the gas barrier layer on a resin film is considered, a plasma CVD method is preferred. On the other hand, when an organic material is used in the gas barrier layer, usually a wet method is used.

Furthermore, examples of the metal material that constitutes the metal foil include aluminum, copper, a copper alloy, phosphor bronze, stainless steel (SUS), gold, a gold alloy, nickel, a nickel alloy, silver, a silver alloy, tin, a tin alloy, titanium, iron, an iron alloy, zinc, and molybdenum. The metal foil may have the surface treated to have releasability.

The thickness of the metal foil is not particularly limited as long as it is a thickness capable of obtaining peelability, and the thickness can be adjusted to the extent that is equal to the thickness of metal foils that are used in general gas barrier films. If the thickness of the metal foil is large, flexibility may decrease, and if the thickness of the metal foil is small, there is a possibility that sufficient gas barrier properties may not be obtained.

In the case of a simple form of a film, as the material, those materials for the base material film can be used.

Furthermore, in the case of the co-extruded film, as the material, composite materials obtained by incorporating fine particles or powders of organic substances or inorganic substances into the resins used in the base material films can be used.

5. Moisture-Proof Section

Figure 7:
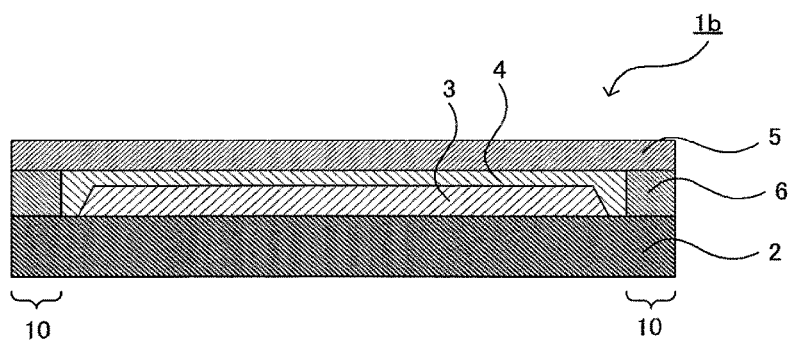
FIG. 7 is a schematic cross-sectional diagram showing still another example of the heat-conductive sealing member of the present invention.
Figure 8:
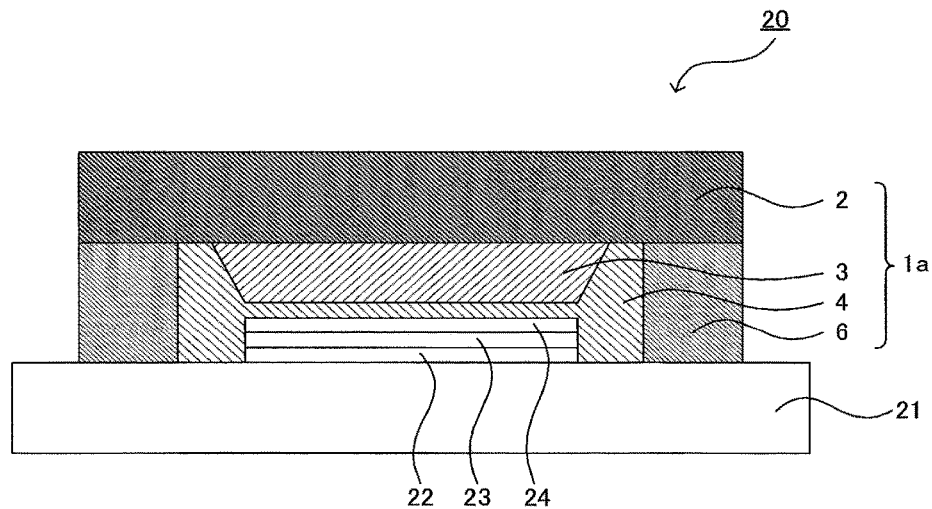
FIG. 8 is a schematic cross-sectional diagram showing another example of the EL element of the present invention.

According to the present invention, as illustrated in FIG. 7, a moisture-proof section 6 may be formed in the outer peripheral area 10 of the metal base material 2. It is because when a moisture-proof section is formed, the penetration of moisture from the outside can be prevented. Furthermore, when an EL element is encapsulated using the heat-conductive sealing member of the present invention, as illustrated in FIG. 8, encapsulation of the EL element 20 is made possible, in the case where the heat-conductive sealing member does not have a peeling layer, only by directly affixing the heat-conductive sealing member, and in the case where the heat-conductive sealing member has a peeling layer, only by detaching the peeling layer from the heat-conductive sealing member and affixing the heat-conductive sealing member, to the transparent substrate 21 on which a transparent electrode layer 22, an EL layer 23 and a back surface electrode layer 24 are laminated. Also, the EL element can be encapsulated by a simple method without requiring complicated processes.

The water vapor permeability of the moisture-proof section is preferably $1.0 \times 10^{-1}$ g/m$^2$/day or less. Meanwhile, the method for measuring the water vapor permeability is the same as the method described in the section for the peeling layer.

The material constituting the moisture-proof section is not particularly limited as long as the material has a function of preventing the penetration of moisture, and examples include thermosetting resins and photocurable resins such as a polyimide resin, a silicone resin, an epoxy resin, and an acrylic resin.

The moisture-proof section may contain a moisture absorbent. It is because the penetration of moisture from the outside can be more effectively prevented through the moisture absorption by the moisture absorbent in the moisture-proof section. Thereby, when an EL element is produced using the heat-conductive sealing member of the present invention, deterioration of the element performance can be further suppressed. Meanwhile, the moisture absorbent is the same as that described in the section of the insulating layer, and therefore, further description thereon will not be repeated here.

The content of the moisture absorbent is not particularly limited, but the content is preferably in the range of 5 parts by mass to 80 parts by mass, more preferably in the range of 5 parts by mass to 60 parts by mass, and even more preferably in the range of 5 parts by mass to 50 parts by mass, relative to 100 parts by mass of the total amount of the moisture absorbent and the resin.

Furthermore, the moisture-proof section may be formed only in the outer peripheral area of the metal base material, or may also be formed doubly. When the moisture-proof section is formed doubly, the penetration of moisture from the outside can be further prevented. For example, the moisture-proof section may have a first moisture-proof section which contains a moisture absorbent, and a second moisture-proof section which is formed in the outer boundary of this first moisture-proof section, has lower water vapor permeability than the first moisture-proof section, and contains a resin having adhesiveness.

The thickness of the moisture-proof section is usually considered to be of the same extent as the total thickness of the insulating layer and the tacky adhesive layer.

As the method for forming the moisture-proof section, a method of applying a resin composition can be used. When the resin composition is applied, the resin composition may be applied on the metal base material or may be applied on the peeling layer. Furthermore, when a method of die-cutting a processing sheet as will be described below is employed, the resin composition is applied on a peeling sheet. The coating method is not particularly limited as long as the resin composition can be applied in a predetermined area, and for example, a gravure printing method, a screen printing method or a dispenser method can be used.

Furthermore, in the occasion of forming the moisture-proof section in the outer peripheral area of the metal base material, a printing method, a photolithographic method, a method of directly processing with a laser, a method of die-cutting a processing sheet, or the like can be used. In the case of the method of die-cutting a processing sheet, a laminate in which a moisture-proof section is formed on the peeling layer can be obtained by die-cutting a processing sheet having a moisture-proof section formed on a peeling sheet, affixing a peeling layer on the moisture-proof section, and peeling the peeling sheet from the moisture-proof section. As the peeling sheet to be used in this case, common peeling sheets can be used.

6. Other Configurations

According to the present invention, an intermediate layer may be formed between the metal base material and the insulating layer. For example, an intermediate layer formed from an oxide film, which is a product of the oxidation of the metal that constitutes the metal base material, may be formed between the metal base material and the insulating layer. Thereby, the adhesiveness between the metal base material and the insulating layer can be increased. This oxidation film is formed as a result of the oxidation of the surface of the metal base material.

Furthermore, it is also acceptable that the above-mentioned oxide film is also formed on the surface opposite to the surface of the metal base material where the insulating layer is formed.

According to the present invention, when a peeling layer is not formed, it is preferable that the heat-conductive sealing member be rolled up in a roll form, with the tacky adhesive layer being in the inner side and the metal base material being in the outer side. It is because handling can be facilitated thereby.

The heat-conductive sealing member of the present invention may be in a sheet form, or may be long lengthy. Also, the heat-conductive sealing member of the present invention may be flexible or may not be flexible.

7. Use

The heat-conductive sealing member of the present invention is used in elements where the prevention of the penetration of moisture and the impartation of the heat dissipation function is required. Specific examples of the element include semiconductor elements such as an EL element, an organic thin film solar cell, and a solid-state sensor. Among them, the heat-conductive sealing member is suitable for the EL elements for illumination purpose.

B. EL Element

Next, the EL element of the present invention will be explained.

The EL element of the present invention is an EL element comprising: a transparent substrate; a transparent electrode layer formed on the transparent substrate; an EL layer that is formed on the transparent electrode layer and includes at least a light emitting layer; a back surface electrode layer formed on the EL layer; and a heat-conductive sealing member formed so as to cover the transparent electrode layer, the EL layer and the back surface electrode layer, characterized in that the heat-conductive sealing member comprises: a metal base material; an insulating layer that is formed on the metal base material, has heat conductivity and contains at least polyimide; and a tacky adhesive layer that is formed on the insulating layer and has heat resistance, and that the tacky adhesive layer is adhered to the transparent substrate so as to cover the transparent electrode layer, the EL layer and the back surface electrode layer.

The EL element of the present invention will be described while making reference to the attached drawings.

FIG. 2 is a schematic cross-sectional diagram showing an example of the EL element of the present invention. The EL element 20 illustrated in FIG. 2 comprises: a transparent substrate 21; a transparent electrode layer 22 formed on the transparent substrate 21; an EL layer 23 that is formed on the transparent electrode layer 22 and has at least a light emitting layer; a back surface electrode layer 24 formed on the EL layer 23; a heat-conductive sealing member 1a formed so as to cover the transparent electrode layer 22, the EL layer 23 and the back surface electrode layer 24; and a sealing resin section 25 formed on the transparent substrate 21 so as to surround the outer boundary of the heat-conductive sealing member 1a. The heat-conductive sealing member 1a comprises: a metal base material 2; an insulating layer 3 that is formed on the metal base material 2, has heat conductivity, and contains at least polyimide; and a tacky adhesive layer 4 that is formed on the insulating layer 3 and has heat resistance. Also, the tacky adhesive layer 4 of the heat-conductive sealing member 1a is adhered to the transparent substrate 21 so as to cover the transparent electrode layer 22, the EL layer 23 and the back surface electrode layer 24. The EL element 20 illustrated in FIG. 2 can be obtained by, for example, using the heat-conductive sealing member 1a shown in FIG. 1 or the heat-conductive sealing member 1b shown in FIG. 3.

Figure 9:
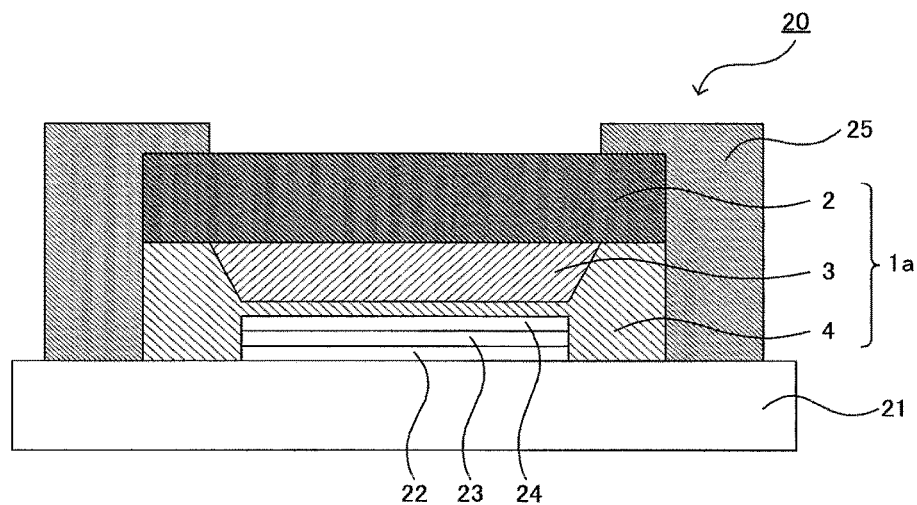
FIG. 9 is a schematic cross-sectional diagram showing yet another example of the EL element of the present invention.
Figure 10:
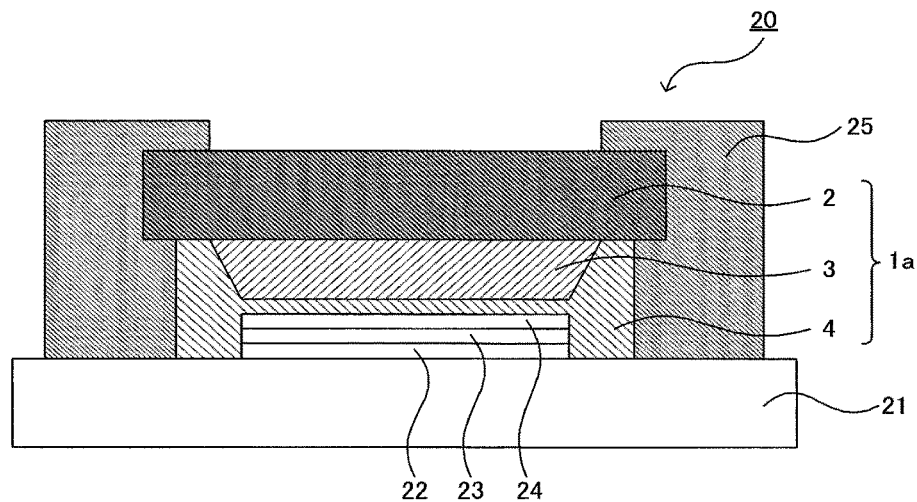
FIG. 10 is a schematic cross-sectional diagram showing still another example of the EL element of the present invention.

FIG. 9 and FIG. 10 are schematic cross-sectional diagram showing other examples of the EL element of the present invention. The EL elements 20 illustrated in FIG. 9 and FIG. 10 differ from the EL element 20 illustrated in FIG. 2 in terms of the configuration of the heat-conductive sealing member 1a. In the heat-conductive sealing member 1a illustrated in FIG. 9, an insulating layer 3 is formed in an area excluding the outer peripheral area of the metal base material 2. The EL element 20 illustrated in FIG. 9 can be obtained by, for example, using the heat-conductive sealing member 1b shown in FIGS. 4A and 4B. On the other hand, in the heat-conductive sealing member 1a illustrated in FIG. 10, an insulating layer 3 and a tacky adhesive layer 4 are formed in an area excluding the outer peripheral area of the metal base material 2. The EL element 20 illustrated in FIG. 10 can be obtained by, for example, using the heat-conductive sealing member 1b shown in FIG. 5.

FIG. 8 is a schematic cross-sectional diagram showing another example of the EL element of the present invention. The EL element 20 illustrated in FIG. 8 differs from the EL element 20 illustrated in FIG. 2 in terms of the fact that a sealing resin section is not formed and in terms of the configuration of the heat-conductive sealing member 1a. The EL element 20 illustrated in FIG. 8 comprises: a transparent substrate 21; a transparent electrode layer 22 formed on the transparent substrate 21; an EL layer 23 that is formed on the transparent electrode layer 22 and has at least a light emitting layer; a back surface electrode layer 24 formed on the EL layer 23; and a heat-conductive sealing member 1a formed so as to cover the transparent electrode layer 22, the EL layer 23 and the back surface electrode layer 24. The heat-conductive sealing member 1a comprises: a metal base material 2; an insulating layer 3 that is formed on the metal base material 2 in an area excluding the outer peripheral area of the metal base material 2, has heat conductivity, and contains at least polyimide; a tacky adhesive layer 4 that is formed on the insulating layer 3 in an area excluding the outer peripheral area of the metal base material 2 and has heat resistance; and a moisture-proof section 6 formed in the outer peripheral area of the metal base material 2. Also, the tacky adhesive layer 4 of the heat-conductive sealing member 1a is adhered to the transparent substrate 21 so as to cover the transparent electrode layer 22, the EL layer 23 and the back surface electrode layer 24. The EL element 20 illustrated in FIG. 8 can be obtained by, for example, using the heat-conductive sealing member 1b shown in FIG. 7.

Figure 11:
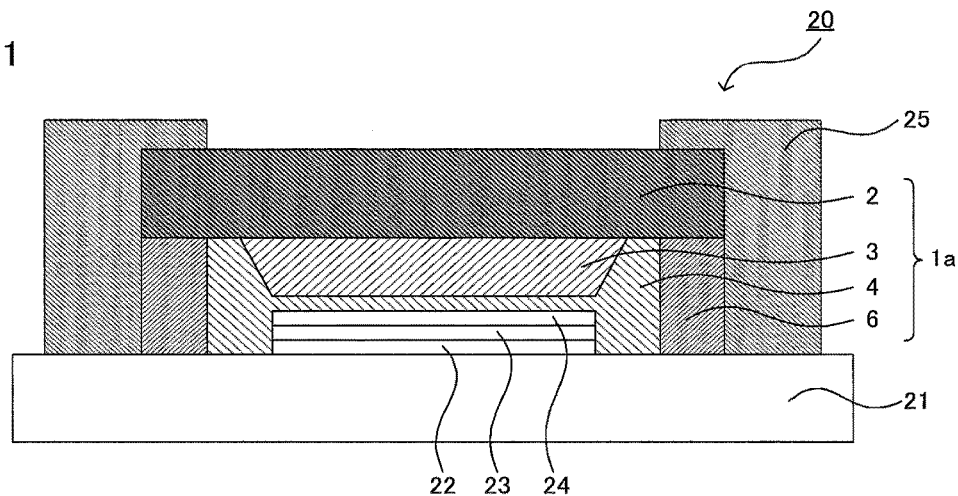
FIG. 11 is a schematic cross-sectional diagram showing still another example of the EL element of the present invention.

FIG. 11 is a schematic cross-sectional diagram showing another example of the EL element of the present invention. The EL element 20 illustrated in FIG. 11 differs from the EL element 20 illustrated in FIG. 2 in terms of the configuration of the heat-conductive sealing member 1a. The heat-conductive sealing member 1a illustrated in FIG. 11 comprises: a metal base material 2; an insulating layer 3 that is formed on the metal base material 2 in an area excluding the outer peripheral area of the metal base material 2, has heat conductivity, and contains at least polyimide; a tacky adhesive layer 4 that is formed on the insulating layer 3 in an area excluding the outer peripheral area of the metal base material 2, and has heat resistance; and a moisture-proof section 6 formed in an area excluding the outer peripheral area of the metal base material 2. The EL element 20 illustrated in FIG. 11 can be obtained by, for example, using the heat-conductive sealing member 1b shown in FIG. 7.

According to the present invention, since the heat-conductive sealing member described above is used, high moisture barrier properties are exhibited, and also, heat can be rapidly conducted or dissipated. Therefore, the luminescence characteristics can be maintained stably over a long time period, and uniform light emission without emission unevenness can be realized, while shortening of the service life or destruction of the element can be reduced.

Furthermore, according to the present invention, the heat-conductive sealing member and the transparent substrate in which a transparent electrode layer, an EL layer and a back surface electrode layer are laminated can be closely adhered by affixing the tacky adhesive layer of the heat-conductive sealing member to the transparent substrate that supports an EL element. Thus, an EL element can be encapsulated by a simple method without requiring any complicated process. Also, according to the present invention, since the tacky adhesive layer of the heat-conductive sealing member can be affixed at room temperature to the transparent substrate that supports an EL element, it is advantageous in that the present invention is favorable for the encapsulation of EL elements that are vulnerable to heat, and handling thereof is facilitated.

In addition, according to the present invention, the deterioration of the insulating layer and the tacky adhesive layer due to heat generation can be suppressed.

Meanwhile, the heat-conductive sealing member has been described above in detail in the Section "A. Heat-conductive sealing member," and therefore, further description thereon will not be repeated here. Hereinafter, other configurations of the EL element of the present invention will be explained.

1. EL Layer

The EL layer according to the present invention is a layer which is formed on the transparent electrode layer and includes at least a light emitting layer.

The light emitting layer constituting the EL layer may be an organic light emitting layer, or may be an inorganic light emitting layer. When the light emitting layer is an organic light emitting layer, an organic EL element is obtained, and when the light emitting layer is an inorganic light emitting layer, an inorganic light emitting layer is obtained. Among them, the light emitting layer is preferably an organic light emitting layer. It is because an organic light emitting layer exhibits significant deterioration due to heat generation than an inorganic light emitting layer.

Hereinafter, the case in which the light emitting layer is an organic light emitting layer will be explained.

When the light emitting layer is an organic light emitting layer, the EL layer has a single organic layer or plural organic layers including at least an organic light emitting layer. That is, the EL layer means a layer which includes at least an organic light emitting layer, and whose configuration includes one or more organic layers. Conventionally, when an EL layer is formed by a coating method, it is difficult to laminate a number of layers due to a solvent problem, and accordingly, the EL layer frequently has one organic layer or two organic layers. However, it is also possible to make the EL layer composed of more numerous layers, by designing the organic materials such that they have different solubilities in solvents or by combining a vacuum deposition method.

Examples of the layers that are formed within the EL layer in addition to the organic light emitting layer, include a hole injection layer, a hole transport layer, an electron injection layer and an electron transport layer. The hole injection layer and the hole transport layer may be integrated. Similarly, the electron injection layer and the electron transport layer may be integrated. In addition to them, another layer that is formed inside the EL layer may be a layer which is intended to increase the recombination efficiency by preventing the penetration of holes or electrons, such as in a carrier blocking layer, further preventing the diffusion of excitons, and confining excitons within the light emitting layer.

Such an EL layer frequently has a laminated structure in which various layers are laminated, and there are many types of laminated structures.

In regard to the various layers constituting the EL layer, the same ones that are used in common organic EL elements can be used.

2. Transparent Electrode Layer

The transparent electrode layer according to the present invention is a layer that is formed on the transparent substrate.

The material of the transparent electrode layer is not particularly limited as long as it is an electroconductive material capable of forming a transparent electrode, and for example, electroconductive oxides such as indium tin oxide (ITO), indium zinc oxide (IZO), tin oxide, zinc oxide, indium oxide, and aluminum zinc oxide (AZO) can be used.

In regard to the method for forming a transparent electrode layer and the thickness of the layer, those methods and thicknesses that are used in the electrodes for general EL elements can be used.

3. Back Surface Electrode Layer

The back surface electrode layer according to the present invention is a layer which is formed on the EL layer.

The back surface electrode layer may have transparency or may not have transparency. Inter alia, when a white light reflective layer is formed on the back surface electrode layer, it is preferable that the back surface electrode layer have transparency, or may not have transparency. Among others, when a white light reflective layer is formed on the back surface electrode layer, it is preferable that the back surface electrode layer be transparent. It is because the light emitted from the EL layer can be efficiently reflected at the white light reflective layer.

The material of the back surface electrode layer is not particularly limited as long as it is an electroconductive material, and is appropriately selected depending on the presence or absence of transparency, or the like. Examples include simple forms of metals such as Au, Ta, W, Pt, Ni, Pd, Cr, Cu, Mo, alkali metals, and alkaline earth metals; oxides of these metals; and alloys such as Al alloys such as AlLi, AlCa, and AlMg; Mg alloys such as MgAg; Ni alloys, Cr alloys, alloys of alkali metals, and alloys of alkaline earth metals. These electroconductive materials may be used alone, or two or more kinds may be used in combination. Also, a laminate may be formed using two or more kinds of those electroconductive materials. Furthermore, electroconductive oxides such as indium tin oxide (ITO), indium zinc oxide (IZO), tin oxide, zinc oxide, indium oxide, and aluminum zinc oxide can also be used.

In regard to the method for forming the back surface electrode layer and the thicknesses of the layer, those methods and thicknesses that are used in the electrodes for common EL elements can be applied.

4. Transparent Substrate

The transparent substrate used in the present invention is to support the transparent electrode layer, the EL layer and the back surface electrode layer.

Examples of the transparent substrate include inorganic materials such as quartz and glass; polymeric materials such as polycarbonate (PC), polyethylene terephthalate (PET), polybutylene terephthalate (PBT), polyphenylene sulfide (PPS), polyimide (PI), polyamideimide (PAI), polyether sulfone (PES), polyether imide (PEI), and polyether ether ketone (PEEK); and materials prepared by adding inorganic fine particles or fibers of inorganic substances into these polymeric materials.

The thickness of the transparent substrate is appropriately selected in accordance with the material of the transparent substrate and the use of the EL element. Specifically, the thickness is about 0.005 mm to 5 mm.

5. Sealing Resin Section

According to the present invention, a sealing resin section may be formed on the transparent substrate so as to surround the outer boundary of the heat-conductive sealing member. It is because as the sealing resin section is formed, the penetration of moisture from the outside can be prevented.

The material constituting the sealing resin section is not particularly limited as long as it has a function of preventing the penetration of moisture, and for example, examples include thermosetting resins such as a polyimide resin, a silicone resin, an epoxy resin, and an acrylic resin, and photocurable resins.

The sealing resin section may contain a moisture absorbent. It is because the penetration of moisture from the outside can be more effectively prevented through the moisture absorption by the moisture absorbent in the sealing resin section. Meanwhile, the moisture absorbent is the same as that described in the section for the insulating layer, and therefore, further description thereon will not be repeated here.

The content of the moisture absorbent is not particularly limited, but the content is preferably in the range of 5 parts by mass to 80 parts by mass, more preferably in the range of 5 parts by mass to 60 parts by mass, and even more preferably in the range of 5 parts by mass to 50 parts by mass, relative to 100 parts by mass of the total amount of the moisture absorbent and the resin.

The thickness and width of the sealing resin section are not particularly limited as long as a thickness capable of preventing the penetration of moisture from the outside is obtained, and the thickness and the width may be appropriately selected in accordance with the use of the EL element.

As the method for forming the sealing resin section, a method of applying a resin composition on the transparent substrate can be used. The coating method is not particularly limited as long as it is a method capable of applying a resin composition in a predetermined area, and for example, a gravure printing method, a screen printing method, and a dispenser method can be used.

6. White Light Reflective Layer

Figure 12:
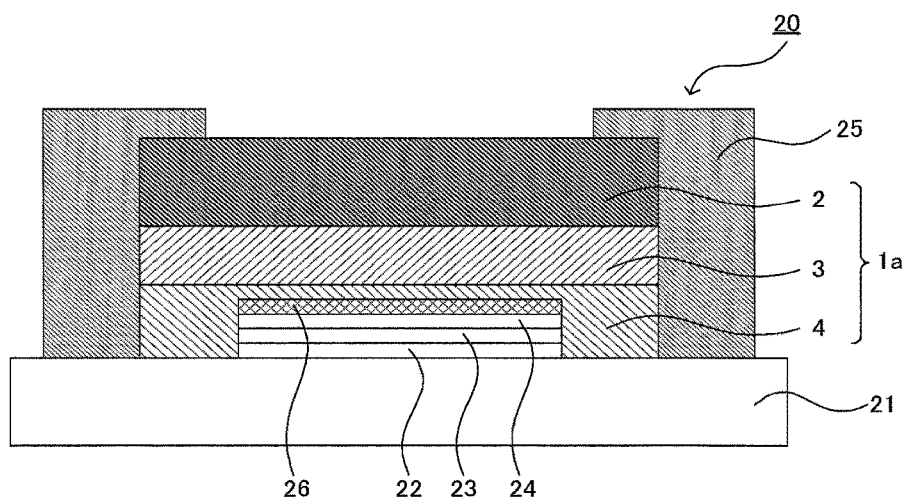
FIG. 12 is a schematic cross-sectional diagram showing another example of the EL element of the present invention.

According to the present invention, as illustrated in FIG. 12, a white light reflective layer 26 may be formed between the back surface electrode layer 24 and the tacky adhesive layer 4 of the heat-conductive sealing member 1a. It is because the light emitted from the EL layer can be diffused and reflected at the white light reflective layer, and the angle-dependency of the emitted light color can be mitigated by the interference effect.

The white light reflective layer usually contains a white pigment and a binder.

Examples of the white pigment include calcium oxide, barium sulfate, zinc oxide, barium stearate, silver flakes, silicate salts, alumina, zirconium oxide, sodium zirconium sulfate, kaolin, mica, and titanium dioxide. Also, non-film forming polymer particles formed of styrene or the like can also be used. These may be used alone, or may be used as mixtures. Among them, titanium dioxide is used with preference.

Furthermore, the binder may be, for example, an alkali-penetrable polymer matrix, and specific examples include gelatin, polyvinyl alcohol, and cellulose derivatives such as hydroxyethyl cellulose and carboxymethyl cellulose.

The mass ratio of the white pigment:binder may be, for example, 1:1 to 20:1.

7. Method for Manufacturing EL Element

The EL element of the present invention is obtained by affixing a heat-conductive sealing member on a transparent substrate where a transparent electrode layer, an EL layer and a back surface electrode layer are laminated. When the heat-conductive sealing member has a peeling layer, the sealing member is affixed after the peeling layer is peeled off.

As the method for affixing the heat-conductive sealing member, there are no particular limitations as long as it is a method capable of affixing the heat-conductive sealing member such that no air bubbles enter between the transparent substrate on which a transparent electrode layer, an EL layer and a back surface electrode layer are laminated, and the tacky adhesive layer of the heat-conductive sealing member. The method may be appropriately selected in accordance with the morphology of the heat-conductive sealing member. As the atmosphere, the method may be carried out in air, or may be carried out in a vacuum.

Meanwhile, the present invention is not intended to be limited to the exemplary embodiment described above. The exemplary embodiment is only for illustrative purposes and any embodiment having a substantially identical constitution and offering an identical operating effect with the technical idea described in the claims of the present invention, is construed to be included in the technical scope of the present invention.

EXAMPLES

Hereinafter, the present invention will be specifically described by way of Examples and Comparative Examples.
1. Evaluation of Insulating Layer

Production Example 1

4.0 g (20 mmol) of 4,4'-diaminodiphenyl ether (ODA) and 8.65 g (80 mmol) of para-phenylenediamine (PPD) were introduced into a 500-ml separable flask, and were dissolved in 200 g of dehydrated N-methyl-2-pyrrolidone (NMP). Under a nitrogen gas stream, the solution was heated in an oil bath while stirred, while the liquid temperature was monitored with a thermocouple to be maintained at 50° C. After it was confirmed that the compounds were completely dissolved, 29.1 g (99 mmol) of 3,3',4,4'-biphenyltetracarboxylic acid dianhydride (BPDA) was added thereto in small amounts over 30 minutes. After completion of the addition, the mixture was stirred for 5 hours at 50° C. Thereafter, the reaction mixture was cooled to room temperature, and thus a polyimide precursor solution 1 was obtained.

Production Examples 2 to 12 and 15 to 17

Polyimide precursor solutions 2 to 12 and 15 to 17, and a polyimide precursor solution Z (Comparative Example) were synthesized at the mixing ratios indicated in the following Table 1, in the same manner as in Production Example 1, except that the amount of NMP was adjusted so that the reaction temperature and the solution concentration would be 17% by weight to 19% by weight.

As the acid dianhydride, 3,3',4,4'-biphenyltetracarboxylic acid dianhydride (BPDA), pyromellitic dianhydride (PMDA), p-phenylenebistrimellitic acid monoester acid dianhydride (TAHQ), and p-biphenylbistrimellitic acid monoester acid dianhydride (BPTME) were used. As the diamine, one kind or two or more kinds of 4,4'-diaminodiphenyl ether (ODA), para-phenylenediamine (PPD), 1,4-bis(4-aminophenoxy)benzene (4APB), 2,2'-dimethyl-4,4'-diaminobiphenyl (TBHG), and 2,2'-bis(trifluoromethyl)-4,4'-diaminobiphenyl (TFMB) were used.

Production Example 13

In order to obtain a photosensitive polyimide, {[(4,5-dimethoxy-2-nitrobenzyl)oxy]carbonyl}-2,6-dimethylpiperidine (DNCDP) was added to the polyimide precursor solution 1 in an amount of 15% by weight of the solids content of the solution. Thus, a photosensitive polyimide precursor solution 1 was obtained.

Production Example 14

In order to obtain a photosensitive polyimide, an amide compound (HMCP) synthesized from 2-hydroxy-5-methoxycinnamic acid and piperidine was added to the polyimide precursor solution 1 in an amount of 10% by weight of the solids content of the solution. Thus, a photosensitive polyimide precursor solution 2 was obtained.

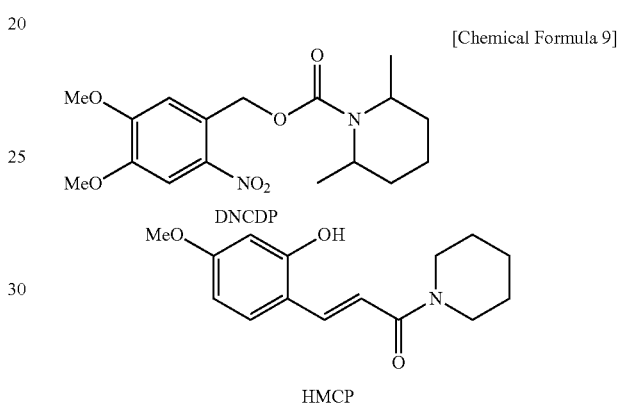

[Chemical Formula 9]

[Evaluation of Coefficient of Linear Thermal Expansion and Coefficient of Hygroscopic Expansion]

Each of the polyimide precursor solutions 1 to 12 and 15 to 17 and the polyimide precursor solution Z was applied on a heat resistant film (Upilex S 50S™: manufactured by Ube Industries, Ltd.) attached onto a glass plate, and the polyimide precursor solution was dried for 10 minutes on a hot plate at 80° C. Subsequently, the dried composition was

TABLE 1

| Polyimide precursor solution | Acid dianhydride Type | Amount of addition (mmol) | Diamine Type | Amount of addition (mmol) | Diamine Type | Amount of addition (mmol) | Reaction temperature (° C.) |
|---|---|---|---|---|---|---|---|
| 1 | BPDA | 99 | PPD | 80 | ODA | 20 | 50 |
| 2 | BPDA | 99 | PPD | 100 | — | — | 50 |
| 3 | BPDA | 99 | PPD | 80 | 4APB | 20 | 50 |
| 4 | BPDA | 99 | — | — | TBHG | 100 | 50 |
| 5 | BPDA | 99 | ODA | 80 | TBHG | 20 | 50 |
| 6 | BPDA | 99 | ODA | 75 | TBHG | 25 | 50 |
| 7 | BPDA | 99 | — | — | TFMB | 100 | 50 |
| 8 | BPDA | 99 | PPD | 80 | TFMB | 20 | 50 |
| 9 | BPDA | 99 | PPD | 70 | TFMB | 30 | 50 |
| 10 | PMDA | 99 | — | — | TBHG | 100 | 0 |
| 11 | PMDA | 99 | — | — | ODA | 100 | 0 |
| 12 | PMDA | 99 | PPD | 50 | ODA | 50 | 0 |
| 15 | BPTME | 99 | — | — | ODA | 100 | 50 |
| 16 | TAHQ | 99 | — | — | ODA | 100 | 50 |
| 17 | TAHQ | 99 | PPD | 75 | ODA | 25 | 50 |
| Z | BPDA | 99 | — | — | ODA | 100 | 50 | peeled off from the heat resistant film, and thus a film having a thickness of 15 μm to 20 μm was obtained. Thereafter, the film was fixed to a frame made of a metal, and was heat treated for one hour at 350° C. (rate of temperature increase: 10° C./min, natural cooling) in a nitrogen atmosphere. Thus, films of polyimides 1 to 12 and 15 to 17 and polyimide Z (Comparative Example), each having a thickness of 9 μm to 15 μm, were obtained.

Furthermore, each of the photosensitive polyimide precursor solutions 1 and 2 was applied on a heat resistant film (Upilex S 50S™: manufactured by Ube Industries, Ltd.) attached onto a glass plate, and the polyimide precursor solution was dried for 10 minutes on a hot plate at 100° C. Subsequently, the dried composition was exposed to a high pressure mercury lamp at a dose of 2,000 mJ/cm$^2$ in terms of the illuminance at a wavelength of 365 nm, and then was heated to 170° C. on a hot plate for 10 minutes. Subsequently, the dried composition was peeled off from the heat resistant film, and thus a film having a thickness of 10 μm was obtained. Thereafter, the film was fixed to a frame made of a metal, and was heat treated for one hour at 350° C. (rate of temperature increase: 10° C./min, natural cooling) in a nitrogen atmosphere. Thus, films of photosensitive polyimide 1 and photosensitive polyimide 2, each having a thickness of 6 μm, were obtained.

<Coefficient of Linear Thermal Expansion>

Each of the films produced by the method described above was cut to a size of 5 mm in width×20 mm in length, and this was used as an evaluation sample. The coefficient of linear thermal expansion was measured using a thermomechanical analyzer, Thermo Plus TMA8310™ (manufactured by Rigaku Corp.). For the measurement conditions, the observation length of the evaluation sample was set to 15 mm, the rate of temperature increase was set to 10° C./min, and the tensile load was set to 1 g/25,000 μm$^2$ so that the load per cross-sectional area of the evaluation sample was uniform. The average coefficient of linear thermal expansion in the temperature range of 100° C. to 200° C. was designated as the coefficient of linear thermal expansion (C.T.E.).

<Coefficient of Hygroscopic Expansion>

Each of the films produced by the method described above was cut to a size of 5 mm in width×20 mm in length, and this was used as an evaluation sample. The coefficient of hygroscopic expansion was measured using an adjustable humidity mechanical analyzer, Thermo Plus TMA8310™ (manufactured by Rigaku Corp.). The temperature was set constant at 25° C., and first, the sample was brought to a stabilized state in an environment at a humidity of 15% RH and was maintained in that state for approximately 30 minutes to 2 hours. Subsequently, the humidity of the measurement site was adjusted to 20% RH, and the sample was maintained in that state for 30 minutes to 2 hours until the sample was stabilized. Thereafter, the humidity was changed to 50% RH, and the difference between the sample length obtainable when the sample was stabilized at the humidity and the sample length obtainable when the sample was stabilized at 20% RH was determined. The value calculated by dividing the difference of sample length by the change of humidity (in this case, 50−20=30), and dividing this value by the sample length, was designated as the coefficient of hygroscopic expansion (C.H.E.). At this time, the tensile load was set to 1 g/25,000 μm$^2$ so that the load per cross-sectional area of the evaluation sample was uniform.

[Evaluation of Substrate Warpage]

Polyimide films of the polyimides 1 to 12 and Z, and polyimide films of the photosensitive polyimides 1 and 2 were formed on a SUS304-HTA™ foil (manufactured by Toyo Seihaku Co., Ltd.) having a thickness of 18 μm, using the polyimide precursor solutions 1 to 12, 15 to 17 and Z, and the photosensitive polyimide precursor solutions 1 and 2, so as to obtain film thicknesses after imidization of 10 μm±1 μm, under the same process conditions as those used in the sample preparation for the evaluation of the coefficient of linear thermal expansion. Thereafter, each of the laminates of the SUS304 foil and the polyimide films was cut to a size of 10 mm in width×50 mm in length, and this was used as a sample for the evaluation of substrate warpage.

This sample was fixed to the surface of a SUS plate such that only one side of the short edges of the sample was fixed with a Kapton tape. The sample was heated in an oven at 100° C. for one hour, and then inside the oven heated to 100° C., the distance between the short edge on the opposite side of the sample and the SUS plate was measured. In regard to the distance at that time, a sample showing a distance of equal to or greater than 0 mm and equal to or less than 0.5 mm was rated as ○; a sample showing a distance of greater than 0.5 mm and equal to or less than 1.0 mm was rated as Δ; and a sample showing a distance of greater than 1.0 mm was rated as X.

Similarly, this sample was fixed to the surface of a SUS plate such that only one side of the short edges of the sample was fixed with a Kapton tape. The sample was left to stand for one hour in a thermo-hygrostat under the conditions of 23° C. and 85% RH, and then the distance between the short edge on the opposite side of the sample and the SUS plate was measured. In regard to the distance at that time, a sample showing a distance of equal to or greater than 0 mm and equal to or less than 0.5 mm was rated as ○; a sample showing a distance of greater than 0.5 mm and equal to or less than 1.0 mm was rated as Δ; and a sample showing a distance of greater than 1.0 mm was rated as X.

These evaluation results are shown below.

TABLE 2

| Polyimide film | Coefficient of linear thermal expansion (ppm/° C.) | Coefficient of hygroscopic expansion (ppm/% RH) | Evaluation of substrate warpage due to heating | Evaluation of substrate warpage at 23° C. and 85% RH |
|---|---|---|---|---|
| Polyimide 1 | 18.9 | 8.4 | ○ | ○ |
| Polyimide 2 | 10.9 | 8.5 | ○ | ○ |
| Polyimide 3 | 19.3 | 10.9 | ○ | ○ |
| Polyimide 4 | 4.6 | 5.1 | Δ | ○ |
| Polyimide 5 | 12.3 | 6.1 | ○ | ○ |
| Polyimide 6 | 22.0 | 8.7 | ○ | ○ |
| Polyimide 7 | 31.1 | 3.5 | x | ○ |
| Polyimide 8 | 11.4 | 5.9 | ○ | ○ |
| Polyimide 9 | 15.4 | 3.4 | ○ | ○ |
| Polyimide 10 | 14.2 | 3.8 | ○ | ○ |
| Polyimide 11 | 35.2 | 20.4 | x | Δ |
| Polyimide 12 | 17.2 | 21.6 | ○ | x |
| Polyimide 15 | 34.7 | 4.0 | x | ○ |
| Polyimide 16 | 37.7 | 6.5 | x | ○ |
| Polyimide 17 | 15.6 | 9.7 | ○ | ○ |
| Photosensitive polyimide 1 | 26.1 | 16.0 | Δ | Δ |
| Photosensitive polyimide 2 | 22.1 | 13.0 | ○ | ○ |
| Polyimide Z | 43.9 | 21.8 | x | x |

Since the coefficient of linear thermal expansion of the SUS304 foil was 17 ppm/° C., it was verified that when the difference between the coefficients of linear thermal expansion of the polyimide film and the metal foil is large, the warpage of the laminate is large.

Furthermore, it can be seen from Table 2 that, as the coefficient of hygroscopic expansion of the polyimide film is smaller, the warpage of the laminate in a high humidity environment is smaller.

2. Evaluation of Tacky Adhesive Layer

Production Example 1

(Polyimide Tacky Adhesive)

First, polyimide 13 was prepared as follows in order to prepare a thermosetting polyimide resin composition, and also, polyimide 14 was prepared.

(Synthesis of Polyimides 13 and 14)

20.35 g (0.090 mole) of 1,2,4,5-cyclohexanetetracarboxylic acid dianhydride, 118.81 g (0.060 mole) of polyoxypropylene diamine (manufactured by Mitsui Fine Chemicals, Inc., Jeffamine D2000™) and 91.50 g of N-methyl-2-pyrrolidone were combined under a nitrogen gas stream, and the mixture was heated to 200° C. and was subjected to an imidization reaction for 3 hours. Water produced therefrom was separated using a Dean-Stark apparatus. After the reaction, it was confirmed that there was no distillation of water, and the system was left to cool to room temperature (23° C.). Thus, a reaction product (polyimide 13) was obtained. The presence or absence of the production of polyimide 13 was determined by checking the IR spectrum and checking the characteristic absorption of the imide ring at ν (C=O) 1770 and 1706 cm$^{-1}$. Subsequently, 12.08 g (0.060 mole) of 4,4'-diaminodiphenyl ether and 9.74 g of N-methyl-2-pyrrolidone were added to the polyimide 13, and the mixture was heated to 200° C. and was subjected to an imidization reaction for 3 hours. Water produced therefrom was separated using a Dean-Stark apparatus. After the imidization reaction, it was confirmed that distillation of water had stopped, and the reaction product solution was left to cool to room temperature. Thus, a reaction product (polyimide 14) in the reaction product solution was obtained. The presence or absence of the polyimide 14 was checked from the IR spectrum.

(Preparation of Thermosetting Polyimide Resin Compositions 1 to 6)

Thermosetting polyimide resin compositions 1 to 6 were prepared using the polyimide 14. For the cured products using the thermosetting polyimide resin compositions 1 to 6, their heat resistance, rubber elasticity and glass transition temperatures were measured.

First, under a nitrogen gas stream, N,N-(4,4-diphenylmethane)bismaleimide as a crosslinking agent was incorporated into the polyimide 14, and also, an oxidation inhibitor was incorporated to this mixture in an amount of incorporation (weight ratio) indicated in the following Table 3 to thereby obtain a mixture. Subsequently, the mixture was diluted using a liquid mixture of N,N'-dimethylacetamide (DMAc) and 1,3-dioxolane (the mixing ratio of the liquid mixture was such that the volume ratio of DMAc:1,3-dioxolane=50%:50%), to a final solids concentration (wt %) of 25%. The dilution was completely dissolved by stirring at room temperature for one hour. Thus, thermosetting polyimide resin compositions 1 to 6 were obtained.

As the oxidation inhibitor, oxidation inhibitors A1 to A3 shown below were used. Meanwhile, the types of the oxidation inhibitors that are respectively added to the mixtures are as indicated in the following Table 3.

Oxidation inhibitor A1: Hindered phenol-based oxidation inhibitor (manufactured by Ciba Japan K.K., IRGANOX 1010™)

Oxidation inhibitor A2: Hindered phenol-based oxidation inhibitor (manufactured by Ciba Japan K.K., IRGANOX 1098™)

Oxidation inhibitor A3: Combined use of hindered phenol-based oxidation inhibitor (manufactured by Ciba Japan K.K., IRGANOX 1010™) and 1,2,3-benzotriazole (the mixing ratio was such that hindered phenol-based oxidation inhibitor:1,2,3-benzotriazole=2 (parts by weight):1 (part by weight))

TABLE 3

| Thermosetting polyimide resin composition | Amount of incorporation (weight ratio) | | | |
|---|---|---|---|---|
| | Oxidation inhibitor | Polyimide 14 | Crosslinking agent (bismaleimide) | Oxidation inhibitor |
| 1 | A1 | 100 | 15 | 1 |
| 2 | A1 | 100 | 15 | 3 |
| 3 | A1 | 100 | 15 | 5 |
| 4 | A2 | 100 | 15 | 3 |
| 5 | A3 | 100 | 15 | 3 |
| 6 | — | 100 | 15 | 0 |

The glass transition temperature of the cured products obtained by curing the thermosetting polyimide resin compositions 1 to 6 at 200° C. for 30 minutes was −43.0° C., irrespective of the sample, based on the peak-top value of the loss tangent (tan δ) (based on the DMA method), and the storage moduli at 25° C. were in the range of 2.5×10$^5$ Pa to 4.0×10$^5$ Pa. Furthermore, the 5% weight loss temperatures of the thermosetting polyimide resin compositions 1 to 6 were in the range of 290° C. to 300° C. for all of the samples.

Production Example 2

(Acrylic Tacky Adhesive)

100 parts by mass of a tacky adhesive (primary agent) (manufactured by Soken Chemical & Engineering Co., Ltd., product name: SK-2094™) and 1 part by mass of a crosslinking agent (manufactured by Soken chemical & Engineering Co., Ltd., product name: E-5XM™) were mixed, and thereby a tacky adhesive resin composition 1 was prepared. The tacky adhesive resin composition 1 was applied such that the dried film thickness would be about 25 μm, and the resin composition was dried and then aged for 7 days at room temperature. Thus, a tacky adhesive layer was obtained. The glass transition temperature of the cured product was −4° C. based on the peak-top value of the loss tangent (tan δ) (based on the DMA method), and the storage modulus at 25° C. was 1.3×10$^5$ Pa. Also, the 5% weight loss temperature of the tacky adhesive layer was 320° C.

Production Example 3

(Polyester-Based Tacky Adhesive)

100 parts by mass of a tacky adhesive (primary agent) (manufactured by Nippon Synthetic Chemical Industry Co., Ltd., product name: Polyester NP-201™, solids content: 50 wt %) and 5 parts by mass of a crosslinking agent (manufactured by Nippon Polyurethane Industry Co., Ltd., product name: Coronate L™) were mixed, and thereby a tacky adhesive resin composition 2 was prepared. The tacky adhesive resin composition 2 was applied such that the dried film thickness would be about 25 μm, and the resin composition was dried and then aged for 7 days at room temperature. Thus, a tacky adhesive layer was obtained. The glass transition temperature of the cured product was −20°

C. based on the peak-top value of the loss tangent (tan δ) (based on the DMA method), and the storage modulus at 25° C. was 8.0×10$^5$ Pa. Also, the 5% weight loss temperature of the tacky adhesive layer was 280° C.

Production Example 4

(Silicone-Based Tacky Adhesive)
100 parts by mass of a tacky adhesive (primary agent) manufactured by Dow Corning Toray Silicone Co., Ltd., product name: SD4570™, solids content: 60 wt %) and 0.9 part by mass of a curing agent (manufactured by Dow Corning Toray silicone Co., Ltd., product name: SRX212™) were mixed, and thereby a tacky adhesive resin composition 3 was prepared. The tacky adhesive resin composition 3 was applied such that the dried film thickness would be about 25 μm, and the resin composition was heated for 3 minutes at 100° C. Thus, a tacky adhesive layer was obtained. The glass transition temperature of the cured product was −15° C. based on the peak-top value of the loss tangent (tan δ) (based on the DMA method), and the storage modulus at 25° C. was 1.2×10$^5$ Pa. Also, the 5% weight loss temperature of the tacky adhesive layer was 340° C.

3. Evaluation of Heat-Conductive Sealing Member

Production Example (1) Formation of Insulating Layer
(Formation of Insulating Layer 1 (Full-Surface Insulating Layer))
On a SUS304-HTA foil (manufactured by Toyo Seihaku Co., Ltd.) cut to a size which measured 15 cm on each side and having a thickness of 18 μm, each of the polyimide precursor solutions 1 to 10 was coated with a die coater, and the polyimide precursor solution was dried for 60 minutes in air in an oven at 80° C. Subsequently, the dried precursor solution was heat treated for one hour at 350° C. (rate of temperature increase: 10° C./min, natural cooling) in a nitrogen atmosphere. Thus, polyimide films of the polyimides 1 to 10, each having a thickness of 6 μm to 12 μm, were formed, and laminates 1 to 10 were obtained.

Among the laminates 1 to 10, the laminates 1, 2, 3, 5, 6, 8, 9 and 10 were stable against any change in the temperature or humidity environment, and had secured flatness. On the other hand, warpage was observed noticeably in the laminates 4 and 7.

(Formation of Insulating Layer 2 (Patterned Insulating Layer))
On a SUS304-HTA foil (manufactured by Toyo Seihaku Co., Ltd.) cut to a size which measured 15 cm on each side and having a thickness of 18 μm, the polyimide precursor solution 1 was coated with a die coater, and the polyimide precursor solution was dried for 60 minutes in air in an oven at 80° C. Subsequently, a resist was produced on the polyimide precursor film such that the resist was removed and developed in the areas along the edges of the SUS foil, each of which measured 15 mm in width from the outer periphery toward the interior, and simultaneously, the polyimide precursor film was developed. Thereafter, the resist pattern was peeled off, and then the system was heat treated for one hour at 350° C. (rate of temperature increase: 10° C./min, natural cooling) in a nitrogen atmosphere. Thus, a laminate 1P in which the insulating layer in the outer peripheral area was removed was obtained.

The laminate 1P was stable against any change in the temperature or humidity environment, and had secured flatness.

(Formation of Insulating Layer 3 (Patterned Insulating Layer))
A resist pattern was formed on the polyimide film of the laminate 10 such that the resist was removed in the areas along the edges of the SUS foil, each of which measured 15 mm in width from the outer periphery toward the interior. The portions where the polyimide film was exposed were removed by using a polyimide etching solution, TPE-3000™ (manufactured by Toray Engineering Co., Ltd.), and then the resist pattern was peeled off. Thus, a laminate 10P in which the insulating layer in the outer peripheral area was removed was obtained.

The laminate 10P was stable against any change in the temperature or humidity environment, and had secured flatness.

(Formation of Insulating Layer 4 (Patterned Insulating Layer))
On a SUS304-HTA foil (manufactured by Toyo Seihaku Co., Ltd.) cut to a size which measured 15 cm on each side and having a thickness of 18 μm, each of the photosensitive polyimide precursor solutions 1 and 2 was coated with a die coater, and the photosensitive polyimide precursor solution was dried for 60 minutes in air in an oven at 80° C. Subsequently, the areas along the edges of the SUS foil, each of which measured 15 mm in width from the outer periphery toward the interior, were masked (so that the areas would not be irradiated with ultraviolet radiation), and the dried photosensitive polyimide precursor composition was exposed to a high pressure mercury lamp at a dose of 2,000 mJ/cm$^2$ in terms of the illuminance at a wavelength of 365 nm, and then was heated to 170° C. on a hot plate for 10 minutes. Subsequently, the dried composition was heat treated for one hour at 350° C. (rate of temperature increase: 10° C./min, natural cooling) in a nitrogen atmosphere. Thus, polyimide films of the photosensitive polyimide 1 and the photosensitive polyimide 2, each having a thickness of 3 μm, were formed, and thus laminates 11 and 12 were obtained.

The laminates 11 and 12 were stable against any change in the temperature or humidity environment, and had secured flatness.

(2) Production of Metal Base Material
(Production of Metal Base Material 1)
First, dry film resists were laminated on both sides of the laminate 1. Subsequently, the laminate 1 was exposed through the SUS foil side, such that the resist would be removed in a striped form with a line-and-space (L/S) pattern having a width of 200 μm, while the laminate 1 was exposed over the entire surface through the insulating layer side. Subsequently, a resist was produced. Thereafter, the SUS foil was half-etched using a ferric chloride solution, such that the SUS foil remained to a thickness of 9 μm at the opening areas of the resist, and then the resist pattern was peeled off. Thereby, a laminate 1H in which the SUS foil was half-etched at a width of 200 μm was obtained.

(Production of Metal Base Material 2)
First, dry film resists were laminated on both sides of the laminate 1. Subsequently, the laminate 1 was exposed through the SUS foil side, such that the resist would be removed at a constant interval with a line-and-space (L/S) pattern which measured 50 μm on each side, while the laminate 1 was exposed over the entire surface through the insulating layer side. Subsequently, a resist was produced. Thereafter, the SUS foil was half-etched using a ferric chloride solution, such that the SUS foil remained to a thickness of 9 μm at the opening areas of the resist, and then the resist pattern was peeled off. Thereby, a laminate 1H' in which the SUS foil was half-etched in a square pattern which measured 50 μm on each side was obtained.

(3) Formation of Tacky Adhesive Layer (Formation of Tacky Adhesive Layer 1 (Full-Surface Insulating Layer/Full-Surface Tacky Adhesive Layer))

For each of the laminates 1, 2, 3, 5, 6, 8, 9 and 10, each of the thermosetting polyimide resin compositions 1 to 6 was appropriately diluted with a mixed solution of DMAc: 1,3-dioxolane=50%:50%, and the dilution was coated by a die-coating method. The thermosetting polyimide resin composition was heat treated, and then was heated for 30 minutes at 200° C. in air such that a film thickness of 2 μm would be obtained, to form a tacky adhesive layer. Thus, heat-conductive sealing members 1-1, 1-2, 1-3, 1-4, 1-5, 1-6, 2-1, 2-2, 2-3, 2-4, 2-5, 2-6, 3-1, 3-2, 3-3, 3-4, 3-5, 3-6, 5-1, 5-2, 5-3, 5-4, 5-5, 5-6, 6-1, 6-2, 6-3, 6-4, 6-5, 6-6, 8-1, 8-2, 8-3, 8-4, 8-5, 8-6, 9-1, 9-2, 9-3, 9-4, 9-5, 9-6, 10-1, 10-2, 10-3, 10-4, 10-5, and 10-6 were obtained.

Furthermore, for each of the laminates 1H and 1H', the thermosetting polyimide resin composition 4 was appropriately diluted with a mixed solution of DMAc:1,3-dioxolane=50%:50%, and the dilution was coated by a die-coating method. The thermosetting polyimide resin composition was heat treated, and then was heated for 30 minutes at 200° C. in air such that a film thickness of 2 μm would be obtained, to form a tacky adhesive layer. Thus, heat-conductive sealing members 1H-4 and 1H'-4 were obtained.

A barrier film in which a barrier layer was deposited on a polyethylene terephthalate film, was affixed to each of these heat-conductive sealing members such that the barrier layer and the tacky adhesive layer were closely adhered.

All of the heat-conductive sealing members described above were stable against any change in the temperature or humidity environment, and had secured flatness.

(Formation of Tacky Adhesive Layer 2 (Patterned Insulating Layer/Full-Surface Tacky Adhesive Layer))

For each of the laminate 1P, laminate 10P, and laminates 11 and 12, each of the thermosetting polyimide resin compositions 2, 4 and 6 was appropriately diluted with a mixed solution of DMAc:1,3-dioxolane=50%:50%, and the dilution was coated by a die-coating method. The thermosetting polyimide resin composition was heat treated, and then was heated for 30 minutes at 200° C. in air such that a film thickness of 2 μm would be obtained, to form a tacky adhesive layer. Thus, heat-conductive sealing members 1P-2, 1P-4, 1P-6, 10P-2, 10P-4, 10P-6, 11-2, 11-4, 11-6, 12-2, 12-4, and 12-6 were obtained.

A barrier film in which a barrier layer was deposited on a polyethylene terephthalate film, was affixed to each of these heat-conductive sealing members such that the barrier layer and the tacky adhesive layer were closely adhered.

All of the heat-conductive sealing members described above were stable against any change in the temperature or humidity environment, and had secured flatness.

(Formation of Tacky Adhesive Layer 3 (Patterned Insulating Layer/Patterned Tacky Adhesive Layer))

On a peelable film made of polyethylene terephthalate, each of the thermosetting polyimide resin compositions 2, 4 and 6 was coated with a bar coater such that the thickness after drying would be 2 and the resin composition was dried in an oven in air under the conditions of 80° C. and 30 minutes. The film was cut to the same size area as that of the insulating layer in the laminate 1P, laminate 10P, and laminates 11 and 12, and the cut films were affixed to be superimposed with the insulating layers of the laminate 1P, laminate 10P, and laminates 11 and 12. The peelable films were peeled off, and the laminates were heating-treated for 30 minutes at 200° C. in air. Thus, heat-conductive sealing members 1P-2P, 1P-4P, 1P-6P, 102-22, 10P-4P, 102-62, 11-2P, 11-4P, 11-6P, 12-2P, 12-4P, and 12-6P were obtained.

A barrier film in which a barrier layer was deposited on a polyethylene terephthalate film, was affixed to each of these heat-conductive sealing members such that the barrier layer and the tacky adhesive layer were closely adhered.

All of the heat-conductive sealing members described above were stable against any change in the temperature or humidity environment, and had secured flatness.

(Formation of Tacky Adhesive Layer 4)

The tacky adhesive resin composition 1 was coated on the laminate 1 with a bar coater such that the film thickness after aging would be about 2 μm, and the resin composition was dried and then aged for 7 days at room temperature, to thereby form a tacky adhesive layer. Subsequently, the tacky adhesive layer was heated for 60 minutes at 150° C. in air, and thus a heat-conductive sealing member 1-1' was obtained.

(Formation of Tacky Adhesive Layer 5)

The tacky adhesive resin composition 2 was coated on the laminate 1 with a bar coater such that the film thickness after aging would be about 2 μm, and the resin composition was dried and then aged for 7 days at room temperature, to thereby form a tacky adhesive layer. Subsequently, the tacky adhesive layer was heated for 60 minutes at 150° C. in air, and thus a heat-conductive sealing member 1-2' was obtained.

(Formation of Tacky Adhesive Layer 6)

The tacky adhesive resin composition 3 was coated on the laminate 1 with a bar coater such that the film thickness after aging would be about 2 μm, and the resin composition was dried by heating for 3 minutes at 100° C., to thereby form a tacky adhesive layer. Subsequently, the tacky adhesive layer was heated for 30 minutes at 200° C. in air, and thus a heat-conductive sealing member 1-3' was obtained.

(4) Formation of Moisture-Proof Section (Formation of Moisture-Proof Section 1 (Patterned Insulating Layer/Patterned Tacky Adhesive Layer/Single Moisture-Proof Section))

On the tacky adhesive layer of the laminate 1P-4P, a peelable film having the same size as that of this tacky adhesive layer was affixed. Subsequently, a paste incorporated with calcium oxide was applied in a frame form by screen printing along the outer peripheral areas where the SUS foil of the laminate 1P-4P was exposed. Thereafter, the peelable film on the tacky adhesive layer was peeled off, and the laminate was dried at 200° C. in a glove box in a nitrogen atmosphere with the moisture concentration adjusted to 1 ppm or less. Subsequently, a peelable film was affixed to the surface where the tacky adhesive layer was formed, and thus, a heat-conductive sealing member 1P-4P-A in which a moisture-proof section was formed in the outer peripheral areas of the SUS foil, was obtained.

The heat-conductive sealing member 1P-4P-A was stable against any change in the temperature or humidity environment, and had secured flatness.

(Formation of Moisture-Proof Section 2 (Patterned Insulating Layer/Patterned Tacky Adhesive Layer/Double Moisture-Proof Section)

On the tacky adhesive layer of the laminate 1P-4P, a peelable film having the same size as that of this tacky adhesive layer was affixed. Subsequently, the outer peripheral areas where the SUS foil of the laminate 1P-4P was exposed were emptied, and the areas where the SUS foil was exposed in the further outer peripheral areas were emptied. Then, a paste incorporated with calcium oxide was applied in the emptied areas in a frame form by screen printing. Subsequently, the peelable film on the tacky adhesive layer was peeled off, and the laminate was dried at 200° C. in a glove box in a nitrogen atmosphere with the moisture concentration adjusted to 1 ppm or less. Subsequently, a sealing resin made of an epoxy resin was applied with a dispenser in the outer peripheral areas where the SUS foil of the laminate 1P-4P was exposed, and a peelable film was affixed to the surface where the tacky adhesive layer was formed. Thus, a heat-conductive sealing member 1P-4P-A-a in which a double moisture-proof section was formed in the outer peripheral areas of the SUS foil, was obtained.

The heat-conductive sealing member 1P-4P-A-a was stable against any change in the temperature or humidity environment, and had secured flatness.

(5) Production of Organic EL Element

In the following, for the productions of organic EL elements 1 to 6 and 8 to 10, the heat-conductive sealing members described above were used after cutting the sealing members to a square shape which measured 20 mm on each side. For the heat-conductive sealing members having a pattern-shaped insulating layer or a pattern-shaped tacky adhesive layer (1P-4 and 1P-4P), the heat-conductive sealing member had a square shape which measured 20 mm on each side, and the insulating layer or the tacky adhesive layer was removed in the areas along the edges of the SUS foil, each of which measured 5 mm in width from the outer periphery toward the interior.

Also, for the production of organic EL element 7, the heat-conductive sealing member described above was used after cutting the sealing member to a square shape which measured 100 mm on each side.

(Production of Organic EL Element 1(Full-Surface Insulating Layer/Full-Surface Tacky Adhesive Layer))

First, an ITO substrate was prepared in which ITO was patterned in the form of lines having a width of 2 mm, as a positive electrode, on a glass substrate. On that ITO substrate, a film of α-NPD (N,N'-di[(1-naphthyl)-N,N'-diphenyl]-1,1'-biphenyl)-4,4'-diamine) and $MoO_3$ at a volume ratio of 4:1 was formed to a thickness of 40 nm by co-deposition at a deposition rate of 1.0 Å/sec under the conditions of a degree of vacuum of $10^{-5}$ Pa, and thus a hole injection layer was formed. Subsequently, α-NPD was vacuum-deposited to a thickness of 20 nm at a deposition rate of 1.0 Å/sec under the conditions of a degree of vacuum of $10^{-5}$ Pa, and thus a hole transport layer was formed. Subsequently, $Alq_3$ (tris-(8-hydroxyquinoline) aluminum) was used as a host material, and C545t was used as a green light emitting dopant, $Alq_3$ and C545t was formed into a film on the hole transport layer having a thickness of 35 nm by vacuum deposition at a deposition rate of 1 Å/sec under the conditions of a degree of vacuum of $10^{-5}$ Pa, such that the concentration of C545t would be 3 wt %. Thus, a light emitting layer was formed. Subsequently, $Alq_3$ was vacuum deposited to a thickness of 10 nm at a deposition rate of 1.0 Å/sec under the conditions of a degree of vacuum of $10^{-5}$ Pa, and thus an electron transport layer was formed. Next, $Alq_3$ and LiF were used to form a film having a thickness of 15 nm by vacuum deposition, through co-deposition, at a deposition rate of 0.1 Å/sec under the conditions of a degree of vacuum of $10^{-5}$ Pa, and thus an electron injection layer was formed. Finally, Al was used, as a negative electrode, to vacuum deposit a film having a thickness of 200 nm at a deposition rate of 5.0 Å/sec under the conditions of a degree of vacuum of $10^{-5}$ Pa.

After the negative electrode was formed, the element was conveyed from the vacuum deposition apparatus to a glove box in a nitrogen atmosphere with a moisture concentration of 0.1 ppm or less. Also, the barrier film of the heat-conductive sealing member 1-4 shown in FIG. 3 was peeled off, and the element was heated and dried in the glove box. Thereafter, the element and the heat-conductive sealing member were superimposed such that the insulating layer of the heat-conductive sealing member was disposed on the light emitting section, and were affixed. An epoxy resin was applied from the outer side, and the epoxy resin was cured with ultraviolet radiation. Thus, the organic EL element shown in FIG. 2 (designated as organic EL element 1) was obtained.

(Production of Organic EL Element 2 (Patterned Insulating Layer/Full-Surface Tacky Adhesive Layer))

The production process was carried out in the same manner as in the production of organic EL element 1 to the step of forming the negative electrode, and then the element was conveyed from the vacuum deposition apparatus to a glove box in a nitrogen atmosphere with a moisture concentration of 0.1 ppm or less. Also, the barrier film of the heat-conductive sealing member 1P-4 shown in FIGS. 4A and 4B was peeled off, and the element was heated and dried in the glove box. Thereafter, the element and the heat-conductive sealing member were superimposed such that the insulating layer of the heat-conductive sealing member was disposed on the light emitting section, and were affixed. An epoxy resin was applied from the outer side, and the epoxy resin was cured with ultraviolet radiation. Thus, the organic EL element shown in FIG. 9 (designated as organic EL element 2) was obtained.

(Production of Organic EL Element 3 (Patterned Insulating Layer/Patterned Tacky Adhesive Layer))

The production process was carried out in the same manner as in the production of organic EL element 1 to the step of forming the negative electrode, and then the element was conveyed from the vacuum deposition apparatus to a glove box in a nitrogen atmosphere with a moisture concentration of 0.1 ppm or less. Also, the barrier film of the heat-conductive sealing member 1P-4P shown in FIG. 5 was peeled off, and the element was heated and dried in the glove box. Thereafter, the element and the heat-conductive sealing member were superimposed such that the insulating layer of the heat-conductive sealing member was disposed on the light emitting section, and were affixed. An epoxy resin was applied from the outer side, and the epoxy resin was cured by irradiating the epoxy resin with ultraviolet radiation from both the upper direction and the lower direction while the light emission area was shielded with a photomask. Thus, the organic EL element shown in FIG. 10 (designated as organic EL element 3) was obtained.

(Production of Organic EL Element 4 (Patterned Insulating Layer/Patterned Tacky Adhesive Layer/Single Moisture-Proof Section))

The production process was carried out in the same manner as in the production of organic EL element 1 to the step of forming the negative electrode, and then the element was conveyed from the vacuum deposition apparatus to a glove box in a nitrogen atmosphere with a moisture concentration of 0.1 ppm or less. The peeling film of the heat-conductive sealing member 1P-4P-A was peeled off inside the glove box, and the element and the heat-conductive sealing member were superimposed such that the insulating layer of the heat-conductive sealing member was disposed on the light emitting section, and were affixed. An epoxy resin was applied from the outer side, and the epoxy resin was cured with ultraviolet radiation. Thus, the organic EL element shown in FIG. 11 (designated as organic EL element 4) was obtained.

(Production of Organic EL Element 5 (Patterned Insulating Layer/Patterned Tacky Adhesive Layer/Double Moisture-Proof Section))

The production process was carried out in the same manner as in the production of organic EL element 1 to the step of forming the negative electrode, and then the element was conveyed from the vacuum deposition apparatus to a glove box in a nitrogen atmosphere with a moisture concentration of 0.1 ppm or less. Also, the peeling film of the heat-conductive sealing member 1P-4P-A-a was peeled off inside the glove box, and the element and the heat-conductive sealing member were superimposed such that the insulating layer of the heat-conductive sealing member was disposed on the light emitting section, and were affixed. An epoxy resin was applied from the outer side, and the epoxy resin was cured by irradiating the epoxy resin with ultraviolet radiation from both the upper direction and the lower direction while the light emission area was shielded with a photomask. Thus, the organic EL element shown in FIG. 11 (designated as organic EL element 5) was obtained.

(Production of Organic EL Element 6 (Patterned Insulating Layer/Patterned Tacky Adhesive Layer))

The production process was carried out in the same manner as in the production of organic EL element 1 to the step of forming the electron injection layer. On the electron injection layer, Mg and Ag were co-deposited at a volume ratio of 9:1, and thus a second electron injection layer was formed. Subsequently, a transparent electroconductive film formed from IZO was formed on the second electron injection layer by a facing target sputtering method, and thus a negative electrode having a thickness of 150 nm was formed.

Subsequently, a paste formed from calcium oxide was applied on the negative electrode at a site corresponding to the light emission area, and the paste was dried under reduced pressure at 100° C. for one hour in an environment with a moisture concentration of 0.1 ppm or less.

Next, the barrier film of the heat-conductive sealing member 1P-4P was peeled off, and the sealing member was heated and dried in a glove box. Thereafter, the element and the heat-conductive sealing member were superimposed such that the insulating layer of the heat-conductive sealing member was disposed on the light emitting section, and were affixed. An epoxy resin was applied from the outer side, and the epoxy resin was cured with ultraviolet radiation. Thus, an organic EL element 6 was obtained.

(Production of Organic EL Element 7 (Full-Surface Insulating Layer/Full-Surface Tacky Adhesive Layer))

First, an ITO substrate was prepared in which ITO was patterned in the form of lines having a width of 52 mm, as a positive electrode, on a glass substrate. On that ITO substrate, a positive type resist (TFRH™ manufactured by Tokyo Ohka Kogyo Co., Ltd.) was applied by a spin coating method so that the dried film thickness would be 1 μm, and then the positive type resist was baked for 2 minutes at 120° C. Thereafter, the resist was irradiated with ultraviolet radiation at a wavelength of 365 nm, through a photomask, so as to form a light emission area of 50 mm□. The resist was developed for 30 seconds using an organic alkaline developer solution, NMD3™ (manufactured by Tokyo Ohka Kogyo Co., Ltd.), and then was baked for 30 minutes at 240° C. Thus, an insulating layer for EL was formed. Subsequently, the production process was carried out in the same manner as in the production of organic EL element 1 to the step of forming the negative electrode, and the element was encapsulated. Thus, an organic EL element 7 was obtained.

(Production of Organic EL Element 8 (Comparative Example))

The production process was carried out in the same manner as in the production of organic EL element 1 to the step of forming the negative electrode.

A cap-shaped glass sealing member which had been processed by etching so as to have an area larger than the light emission area, was prepared. An epoxy resin was applied along the embankment of this sealing member, and the sealing member was affixed to the element inside a glove box in a nitrogen atmosphere with a moisture concentration of 1 ppm or less. The light emission area was shielded with a photomask, and then the element was irradiated with ultraviolet radiation to cure the epoxy resin. Thus, an organic EL element A was obtained.

(Production of Organic EL Element 9 (Comparative Example))

The production process was carried out in the same manner as in the production of organic EL element 1 to the step of forming the negative electrode.

A cap-shaped glass sealing member which had been processed by etching so as to have an area larger than the light emission area, was prepared. An epoxy resin was applied along the embankment of this sealing member. In a glove box in a nitrogen atmosphere with a moisture concentration of 1 ppm or less, a moisture absorptive sheet formed from calcium oxide was pasted to the recessed portion of the cap of the sealing member, and this sealing member and the element were affixed. The light emission area was shielded with a photomask, and then the element was irradiated with ultraviolet radiation to cure the epoxy resin. Thus, an organic EL element B was obtained.

(Production of Organic EL Element 10 (Comparative Example))

The production process was carried out in the same manner as in the production of organic EL element 7 to the step of forming the negative electrode.

Thereafter, the element was encapsulated in the same manner as in the production of organic EL element 8, and thus an organic EL element C was obtained.

(Production of Organic EL Element 11)

An organic EL element 8 was produced in the same manner as in the production of organic EL element 7, except that the heat-conductive sealing member 1H-4 was used instead of the heat-conductive sealing member 1-4.

(Production of Organic EL Element 12)

An organic EL element 9 was produced in the same manner as in the production of organic EL element 7, except that the heat-conductive sealing member 1H'-4 was used instead of the heat-conductive sealing member 1-4.

(Production of Organic EL Element 13)

An organic EL element 10 was produced in the same manner as in the production of organic EL element 1, except that the heat-conductive sealing member 1-1' was used instead of the heat-conductive sealing member 1-4.

(Production of Organic EL Element 14)

An organic EL element 11 was produced in the same manner as in the production of organic EL element 1, except that the heat-conductive sealing member 1-2' was used instead of the heat-conductive sealing member 1-4.

(Production of Organic EL Element 15)

An organic EL element 12 was produced in the same manner as in the production of organic EL element 1, except that the heat-conductive sealing member 1-3' was used instead of the heat-conductive sealing member 1-4.

[Evaluation]

The organic EL elements 1 to 12 (Invented Examples) and the organic EL elements A to C (Comparative Examples) were compared. The evaluation results are shown in Table 4.

TABLE 4

| Organic EL element | Initial characteristics | 80° C. High-temperature test | Angle-dependency of luminescence intensity | Temperature unevenness | Heat dissipation properties — Sealing member side | Heat dissipation properties — Temperature difference between sealing member side and light emission side | Remarks |
|---|---|---|---|---|---|---|---|
| 1 | ○ | ○ | x | — | — | — | Invented Example |
| 2 | ○ | ○ | x | — | — | — | Invented Example |
| 3 | ○ | ○ | x | — | — | — | Invented Example |
| 4 | ○ | ○ | x | — | — | — | Invented Example |
| 5 | ○ | ○ | x | — | — | — | Invented Example |
| 6 | — | ○ | ○ | — | — | — | Invented Example |
| 7 | — | — | x | ±7° C. | 41° C. | 2° C. | Invented Example |
| 8 | — | — | x | ±5° C. | 38° C. | 2° C. | Invented Example |
| 9 | — | — | x | ±5° C. | 38° C. | 2° C. | Invented Example |
| 10 | ○ | ○ | x | — | — | — | Invented Example |
| 11 | ○ | ○ | x | — | — | — | Invented Example |
| 12 | ○ | ○ | x | — | — | — | Invented Example |
| A | ○ | ○ | x | — | — | — | Comparative Example |
| B | ○ | ○ | x | — | — | — | Comparative Example |
| C | — | — | x | ±15° C. | 56° C. | 5° C. | Comparative Example |

(Initial Characteristics)

For the organic EL elements 1 to 5, 10 to 12 and the organic EL elements A and B, the voltage was increased from 0 V to 15 V at an interval of 0.2 V, and the current values and the luminance values at that time were measured as the initial characteristics. All of the organic EL elements exhibited almost equal, satisfactory characteristics.

(80° C. High-Temperature Storage Test)

The organic EL elements 1 to 6, 10 to 12 and the organic EL elements A and B were subjected to a 80° C. high-temperature storage test, and the presence or absence of the release of moisture from the sealing member was investigated. FIG. 13A and FIG. 13B show the photographs of the organic EL element A and the organic EL element 1, respectively, in their light emitting state after 200 hours under the 80° C. high-temperature storage test. Also, FIG. 14A and FIG. 14B show the photographs of the organic EL element B and the organic EL element 4, respectively, in their light emitting state after 200 hours under the 80° C. high-temperature storage test. When the organic EL elements 1 to 3 and the organic EL element A, which did not use any moisture absorbent, were compared, it was verified that in the organic EL elements 1 to 3, there was no decrease in the light emission area from the edge sections of the light emission areas even after storage for 200 hours, and the occurrence of dark spots that are generated inside the light emission area was of the same extent as that of the organic EL element A. Thus, it was confirmed that the release of moisture from the sealing member was very small.

(Angle-Dependency of Luminescence Intensity)

For the organic EL elements 1 to 12 and the organic EL elements A to C, the angle-dependency of the luminescence intensity of the front surface of the light emitting surface from 0° to 85° was investigated. In the organic EL element 6, it was confirmed that since the calcium oxide layer diffused the light emitted from the light emitting layer, the front surface of the light emitting surface had no angle-dependency of luminescence intensity from 0° to 85°.

(Temperature Unevenness and Heat Dissipation Properties)

In the organic EL elements 7 to 9 and the organic EL element C, in which the light emission areas were adjusted to 50 mm□, the in-plane temperature unevenness and heat dissipation properties were evaluated 10 minutes after lighting at 3000 cd/m² within 50 mm□. For the temperature unevenness, the temperatures at arbitrary nine sites of the light emission area were measured from the glass substrate side, which was the light emitting surface, at room temperature of 26.5° C. using a K thermocouple. For the heat dissipation characteristics, the temperature at the center of the light emission area was measured from both the sealing member side and the light emitting surface side, at room temperature of 26.5° C. using a K thermocouple. The organic EL elements 7 to 9 all exhibited excellent temperature unevenness and heat dissipation properties as compared with the organic EL element C. From the results of the organic EL elements 7 to 9, it was confirmed that when the morphology of the SUS foil was selected to be a morphology having irregularities on the surface that is brought into contact with air as shown in FIG. 6, that is, when a heat sink is introduced, a greater heat dissipation effect can be expected. Furthermore, the organic EL element C that had a sealing member made of glass and did not have a heat-conductive sealing member, exhibited a temperature increase even after 10 minutes after the lighting of the panel; however, the organic EL element 7 that had a heat-conductive sealing member reached a steady state after 8 minutes, the organic EL element 8 reached a steady state after 7 minutes, and the organic EL element 9 reached a steady state after 6 minutes. Thus, the effect of heat dissipation was confirmed.

Therefore, it was verified that the heat-conductive sealing members of the Invented Examples functioned satisfactorily against the heat dissipation or heat distribution of organic EL elements, as compared with the conventional sealing members made of glass.

REFERENCE SIGNS LIST 1a, 1b Heat-conductive sealing member
2 Metal base material
3 Insulating layer
4 Tacky adhesive layer
5 Peeling layer
6 Moisture-proof section
10 Outer peripheral area
20 EL element
21 Transparent substrate
22 Transparent electrode layer
23 EL layer
24 Back surface electrode layer
25 Sealing resin section

The invention claimed is:

1. A heat-conductive sealing member, comprising: a metal base material; an insulating layer that is formed directly on the metal base material, has heat conductivity, and contains at least polyimide; and a tacky adhesive layer that is formed on the insulating layer and has heat resistance, wherein the insulating layer and the tacky adhesive layer are formed in an area excluding the outer peripheral area of the surface of the metal base material on which the insulating layer is formed, wherein a moisture-proof section is formed in the outer peripheral area of the surface of the metal base material, and wherein the tacky adhesive layer contains a thermosetting resin, a photocurable resin, or a thermoplastic resin.

2. The heat-conductive sealing member according to claim 1, wherein the insulating layer contains the polyimide as a main component.

3. The heat-conductive sealing member according to claim 1, wherein a peeling layer is formed on the tacky adhesive layer.

4. The heat-conductive sealing member according to claim 3, wherein the peeling layer has gas barrier properties.

5. The heat-conductive sealing member according to claim 1, wherein a thickness of the insulating layer is in the range of 0.5 µm to 100 µm.

6. The heat-conductive sealing member according to claim 1, wherein a coefficient of hygroscopic expansion of the insulating layer is in the range of 0 ppm %/RH to 15 ppm %/RH.

7. The heat-conductive sealing member according to claim 1, wherein a coefficient of linear thermal expansion of the insulating layer is in the range of 0 ppm/° C. to 30 ppm/° C.

8. The heat-conductive sealing member according to claim 1, wherein in that a difference between a coefficient of linear thermal expansion of the insulating layer and a coefficient of linear thermal expansion of the metal base material is 15 ppm/° C. or less.

9. The heat-conductive sealing member according to claim 1, wherein a 5% weight loss temperature of a tacky adhesive that constitutes the tacky adhesive layer is 80° C. or higher.

10. The heat-conductive sealing member according to claim 1, wherein the tacky adhesive layer contains a curable tacky adhesive.

11. The heat-conductive sealing member according to claim 1, wherein the tacky adhesive layer contains a polyimide resin.

12. The heat-conductive sealing member according to claim 1, wherein the tacky adhesive layer contains an acrylic resin.

13. The heat-conductive sealing member according to claim 1, wherein the tacky adhesive layer contains a polyester resin.

14. The heat-conductive sealing member according to claim 1, wherein the tacky adhesive layer contains a silicone resin.

15. The heat-conductive sealing member according to claim 1, wherein a glass transition temperature (Tg) of a tacky adhesive that constitutes the tacky adhesive layer is 100° C. or lower.

16. The heat-conductive sealing member according to claim 1, wherein a storage modulus at room temperature of the tacky adhesive layer is from $1.0 \times 10^2$ Pa to $1.0 \times 10^7$ Pa.

17. The heat-conductive sealing member according to claim 1, wherein the tacky adhesive layer contains a moisture absorbent.

18. The heat-conductive sealing member according to claim 1, wherein the metal base material has irregularities on a surface that is brought into contact with air.

19. An electroluminescent element comprising: a transparent substrate; a transparent electrode layer formed on the transparent substrate; an electroluminescent layer that is formed on the transparent electrode layer and includes at least a light emitting layer; a back surface electrode layer formed on the electroluminescent layer; and a heat-conductive sealing member formed so as to cover the transparent electrode layer, the electroluminescent layer and the back surface electrode layer, wherein the heat-conductive sealing member comprises: a metal base material; an insulating layer that is formed directly on the metal base material, has heat conductivity and contains at least polyimide; and a tacky adhesive layer that is formed on the insulating layer and has heat resistance, wherein the tacky adhesive layer is adhered to the transparent substrate so as to cover the transparent electrode layer, the electroluminescent layer and the back surface electrode layer, wherein the insulating layer and the tacky adhesive layer are formed in an area excluding the outer peripheral area the surface of of the metal base material on which the insulating layer is formed, wherein a moisture-proof section is formed in the outer peripheral area of the surface of the metal base material, and wherein the tacky adhesive layer contains a thermosetting resin, a photocurable resin, or a thermoplastic resin.

20. The electroluminescent element according to claim 19, wherein a sealing resin section is formed on the transparent substrate so as to surround an outer boundary of the heat-conductive sealing member.

21. The electroluminescent element according to claim 20, wherein the sealing resin section contains a moisture absorbent.

22. The electroluminescent element according to claim 19, wherein the back surface electrode layer has transparency, and a white light reflective layer is formed between the back surface electrode layer and the heat-conductive sealing member.

* * * * *